(12) United States Patent
Osaka et al.

(10) Patent No.: US 12,050,138 B2
(45) Date of Patent: Jul. 30, 2024

(54) SUBSTRATE PROCESSING APPARATUS, AND THERMOCOUPLE

(71) Applicant: KOKUSAI ELECTRIC CORPORATION, Tokyo (JP)

(72) Inventors: Akihiro Osaka, Toyama (JP); Hideto Yamaguchi, Toyama (JP); Tetsuya Kosugi, Toyama (JP); Tokunobu Akao, Toyama (JP); Atsushi Umekawa, Toyama (JP); Motoya Takewaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 96 days.

(21) Appl. No.: 17/532,426

(22) Filed: Nov. 22, 2021

(65) Prior Publication Data
US 2022/0082447 A1    Mar. 17, 2022

Related U.S. Application Data

(60) Continuation of application No. 16/685,643, filed on Nov. 15, 2019, now Pat. No. 11,300,456, which is a
(Continued)

(30) Foreign Application Priority Data

Feb. 25, 2015 (JP) ................................. 2015-035680
Feb. 8, 2016 (JP) ................................. 2016-021846

(51) Int. Cl.
G01K 1/08 (2021.01)
G01K 1/14 (2021.01)
(Continued)

(52) U.S. Cl.
CPC ................. *G01K 1/08* (2013.01); *G01K 1/14* (2013.01); *G01K 7/02* (2013.01); *H01L 21/22* (2013.01);
(Continued)

(58) Field of Classification Search
CPC ... G01K 1/08; G01K 1/14; G01K 7/02; H01L 21/22; H01L 21/324; H01L 21/67098; H01L 21/67248; H01L 22/12
See application file for complete search history.

(56) References Cited

U.S. PATENT DOCUMENTS 5,152,608 A * 10/1992 Dutcher ................... G01K 1/08
374/179
5,855,677 A * 1/1999 Carlson ............. H01L 21/67248
118/724
(Continued)

FOREIGN PATENT DOCUMENTS

CN 100367458 C 2/2008
JP 64-042119 A 2/1989
(Continued)

OTHER PUBLICATIONS

Korean Office Action issued on Dec. 14, 2018 for the Korean Patent Application No. 10-2018-0126100 (*cited in parent application).
(Continued)

*Primary Examiner* — Nathaniel T Woodward
*Assistant Examiner* — Philip L Cotey
(74) *Attorney, Agent, or Firm* — Volpe Koenig

(57) ABSTRACT

A thermocouple includes: a temperature measuring portion configured to measure an internal temperature of a reaction tube; a main body portion provided therein with a wire which constitutes the temperature measuring portion; and a cushioning portion attached to the main body portion at least in the vicinity of the temperature measuring portion,
(Continued)

wherein the thermocouple is fixed to an outer surface of the reaction tube in a state in which the thermocouple makes contact with the reaction tube through the cushioning portion.

20 Claims, 23 Drawing Sheets

Related U.S. Application Data division of application No. 16/046,682, filed on Jul. 26, 2018, now Pat. No. 10,684,174, which is a division of application No. 15/052,137, filed on Feb. 24, 2016, now Pat. No. 10,228,291.

(51) Int. Cl.
| | | |
|---|---|---|
| G01K 7/02 | (2021.01) | |
| H01L 21/22 | (2006.01) | |
| H01L 21/324 | (2006.01) | |
| H01L 21/66 | (2006.01) | |
| H01L 21/67 | (2006.01) | |

(52) U.S. Cl.
CPC ...... H01L 21/324 (2013.01); H01L 21/67098 (2013.01); H01L 21/67248 (2013.01); H01L 22/12 (2013.01)

(56) References Cited

U.S. PATENT DOCUMENTS

| | | | | | |
|---|---|---|---|---|---|
| 6,126,719 | A * | 10/2000 | Sturgill | ...................... | C22B 9/14 |
| | | | | | 423/304 |
| 6,334,707 | B1 * | 1/2002 | Ku | ......................... | G01K 1/143 |
| | | | | | 374/E1.019 |
| 6,761,480 | B2 * | 7/2004 | Parnicza | .................. | G01K 7/02 |
| | | | | | 374/E7.004 |
| 7,036,983 | B2 * | 5/2006 | Green | ....................... | G01K 1/10 |
| | | | | | 374/208 |
| 8,033,717 | B2 * | 10/2011 | Kendall | .................. | G01K 1/125 |
| | | | | | 374/139 |
| 10,409,306 | B2 * | 9/2019 | Ranish | ................... | G05D 23/27 |
| 2003/0209327 | A1 * | 11/2003 | Kuznetsov | ........ | H01L 21/67248 |
| | | | | | 156/345.52 |
| 2003/0231698 | A1 * | 12/2003 | Yamaguchi | .............. | G01K 7/08 |
| | | | | | 374/E7.042 |
| 2006/0021582 | A1 * | 2/2006 | Saito | ................. | H01L 21/67109 |
| | | | | | 118/724 |
| 2006/0141808 | A1 * | 6/2006 | Granneman | ......... | H01L 21/477 |
| | | | | | 438/799 |
| 2007/0163502 | A1 * | 7/2007 | Nozawa | ............ | H01L 21/67109 |
| | | | | | 118/723 R |
| 2009/0095422 | A1 * | 4/2009 | Sugishita | .......... | H01L 21/67109 |
| | | | | | 118/708 |
| 2010/0145547 | A1 * | 6/2010 | Darabnia | ............... | G01K 13/00 |
| | | | | | 374/E7.004 |
| 2011/0031593 | A1 * | 2/2011 | Saito | ................. | H01L 21/02263 |
| | | | | | 257/632 |
| 2011/0204036 | A1 * | 8/2011 | Murobayashi | .... | H01L 21/67109 |
| | | | | | 219/201 |
| 2012/0310440 | A1 * | 12/2012 | Darabnia | ................ | C23C 16/46 |
| | | | | | 374/E7.004 |
| 2013/0017628 | A1 * | 1/2013 | Kosugi | ............ | H01L 21/67248 |
| | | | | | 374/E7.004 |
| 2013/0059430 | A1 * | 3/2013 | Sivaramakrishnan | ...................... | |
| | | | | | C23C 16/481 |
| | | | | | 257/E21.101 |
| 2013/0167772 | A1 * | 7/2013 | Sato | ........................ | C23C 16/44 |
| | | | | | 118/712 |
| 2014/0120636 | A1 * | 5/2014 | Yamaguchi | .............. | G01K 7/02 |
| | | | | | 219/400 |
| 2014/0211830 | A1 * | 7/2014 | Saito | ........................ | G01K 1/14 |
| | | | | | 374/179 |
| 2015/0132972 | A1 * | 5/2015 | Wada | ................. | H01L 21/02282 |
| | | | | | 118/724 |
| 2016/0169749 | A1 * | 6/2016 | Glasheen | ................ | G01K 1/08 |
| | | | | | 374/179 |
| 2019/0019699 | A1 * | 1/2019 | Aburatani | ......... | H01L 21/67103 |

FOREIGN PATENT DOCUMENTS

| | | | |
|---|---|---|---|
| JP | 07-286907 | A | 10/1995 |
| JP | 2000-031062 | A | 1/2000 |
| JP | 2001-183237 | A | 7/2001 |
| JP | 2004-119788 | A | 4/2004 |
| JP | 2009-081415 | A | 4/2009 |
| JP | 2011-052319 | A | 3/2011 |
| JP | 2011-199258 | A | 10/2011 |
| JP | 2012-093663 | A | 5/2012 |
| JP | 2012-195375 | A | 10/2012 |
| JP | 2013-016536 | A | 1/2013 |
| JP | 2014-067766 | A | 4/2014 |
| KR | 10-2009-0026059 | A | 3/2009 |
| KR | 10-2013-0053760 | A | 5/2013 |
| KR | 10-2014-0039987 | A | 4/2014 |
| KR | 10-2015-0018876 | A | 2/2015 |

OTHER PUBLICATIONS

Japanese Office Action issued Feb. 20, 2019 for the Japanese Patent Application No. 2016-021846 (*cited in parent application).
Taiwanese Office Action dated Jun. 19, 2019 for the Taiwanese Patent Application No. 107128038 (*cited in parent application).
Korean Office Action issued on Apr. 20, 2020 for he Korean Patent Application No. 10-2020-0043253 (*cited in parent application).
Taiwanese Office Action issued on Dec. 15, 2020 for Taiwanese Patent Application No. 108146720 (*cited in parent application).
Japanese Office Action issued on Aug. 4, 2020 for Japanese Patent Application No. 2019-154382 (*cited in parent application).
Korean Office Action issued on Jul. 16, 2021 for Korean Patent Application No. 10-2021-0067927 (*cited in parent application).

* cited by examiner

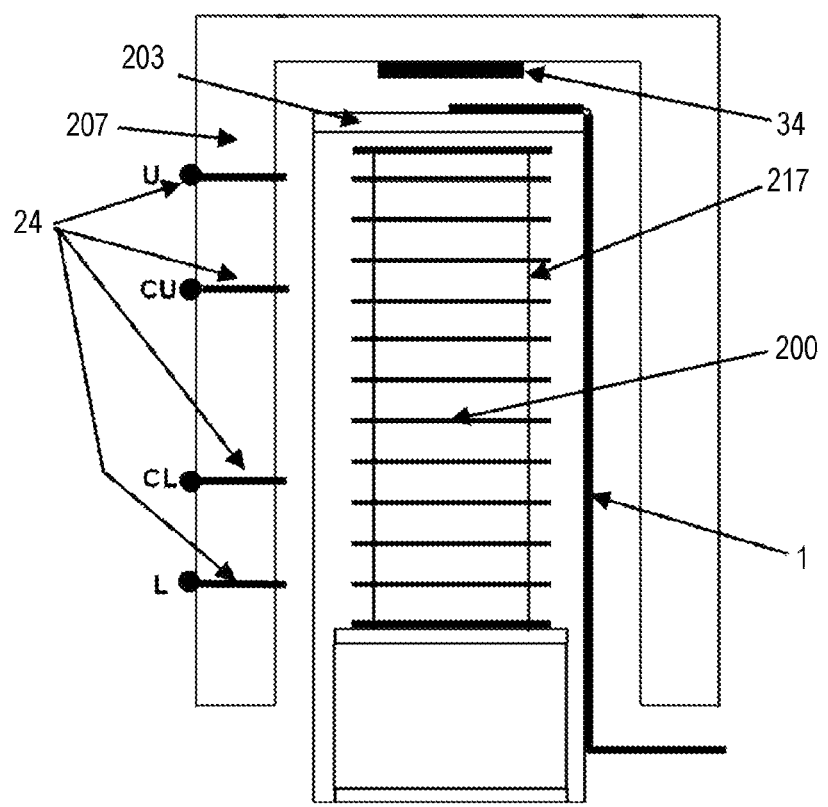

SUBSTRATE PROCESSING APPARATUS, AND THERMOCOUPLE

CROSS-REFERENCE TO RELATED APPLICATION(S)

This application is a continuation of U.S. patent application Ser. No. 16/685,643, filed Nov. 15, 2019, which is a divisional of U.S. patent application Ser. No. 16/046,682, filed Jul. 26, 2018, which is issued as U.S. Pat. No. 10,684, 174 on Jun. 16, 2020, which is a divisional of U.S. patent application Ser. No. 15/052,137, filed Feb. 24, 2016, which issued as U.S. Pat. No. 10,228,291 on Mar. 12, 2019, which is based upon and claims the benefit of priority from Japanese Patent Application Nos. 2015-035680, filed on Feb. 25, 2015 and 2016-021846, filed on Feb. 8, 2016, the entire contents of which are incorporated herein by reference.

TECHNICAL FIELD

The present disclosure relates to a substrate processing apparatus, and a thermocouple.

BACKGROUND

It is known that a semiconductor manufacturing apparatus is available as one example of a substrate processing apparatus and further that a vertical apparatus is available as one example of the semiconductor manufacturing apparatus. As the substrate processing apparatus of this kind, there is known a substrate processing apparatus which includes a boat as a substrate support member provided within a reaction tube and configured to hold substrates (wafers) in multiple stages and which is configured to process the substrates held by the boat at a predetermined temperature in a process chamber defined within the reaction tube.

There is disclosed a technique in which a plurality of wafers is held by a boat and is inserted into a reaction tube. In this state, films are formed on the wafers by supplying a precursor gas to the wafers disposed within the reaction tube, while maintaining the internal temperature of the reaction tube at a predetermined temperature based on temperature information detected by a temperature sensor as a detection means installed within the reaction tube.

However, in the configuration mentioned above, the temperature sensor is installed within the reaction tube in which film formation is performed. Thus, there may be a case where a film is formed on a quartz-made protective tube for protecting a temperature detection part. Accordingly, a problem is posed in that the protective tube is damaged under the influence of a thermal stress and may become a particle generation source.

SUMMARY

The present disclosure provides some embodiments of a configuration in which a thermocouple is installed outside a reaction tube rather than inside the reaction tube.

According to one aspect of the present disclosure, there is provided a thermocouple, including:
- a temperature measuring portion configured to measure an internal temperature of a reaction tube;
- a main body portion provided therein with a wire which constitutes the temperature measuring portion; and
- a cushioning portion attached to the main body portion at least in the vicinity of the temperature measuring portion,
wherein the thermocouple is fixed to an outer surface of the reaction tube in a state in which the thermocouple makes contact with the reaction tube through the cushioning portion.

BRIEF DESCRIPTION OF THE DRAWINGS

FIG. 20 is a schematic configuration view of a vertical processing furnace of a substrate processing apparatus suitably employed in an embodiment of the present disclosure, in which a portion of the processing furnace is shown in a vertical cross section when the thermocouple attachment position (height) is improved.

DETAILED DESCRIPTION

First Embodiment of the Present Disclosure

A first embodiment of the present disclosure will now be described with reference to FIGS. 1 and 2. The substrate processing apparatus according to the present disclosure is configured as one example of a semiconductor manufacturing apparatus for use in manufacturing a semiconductor device.

Figure 1:
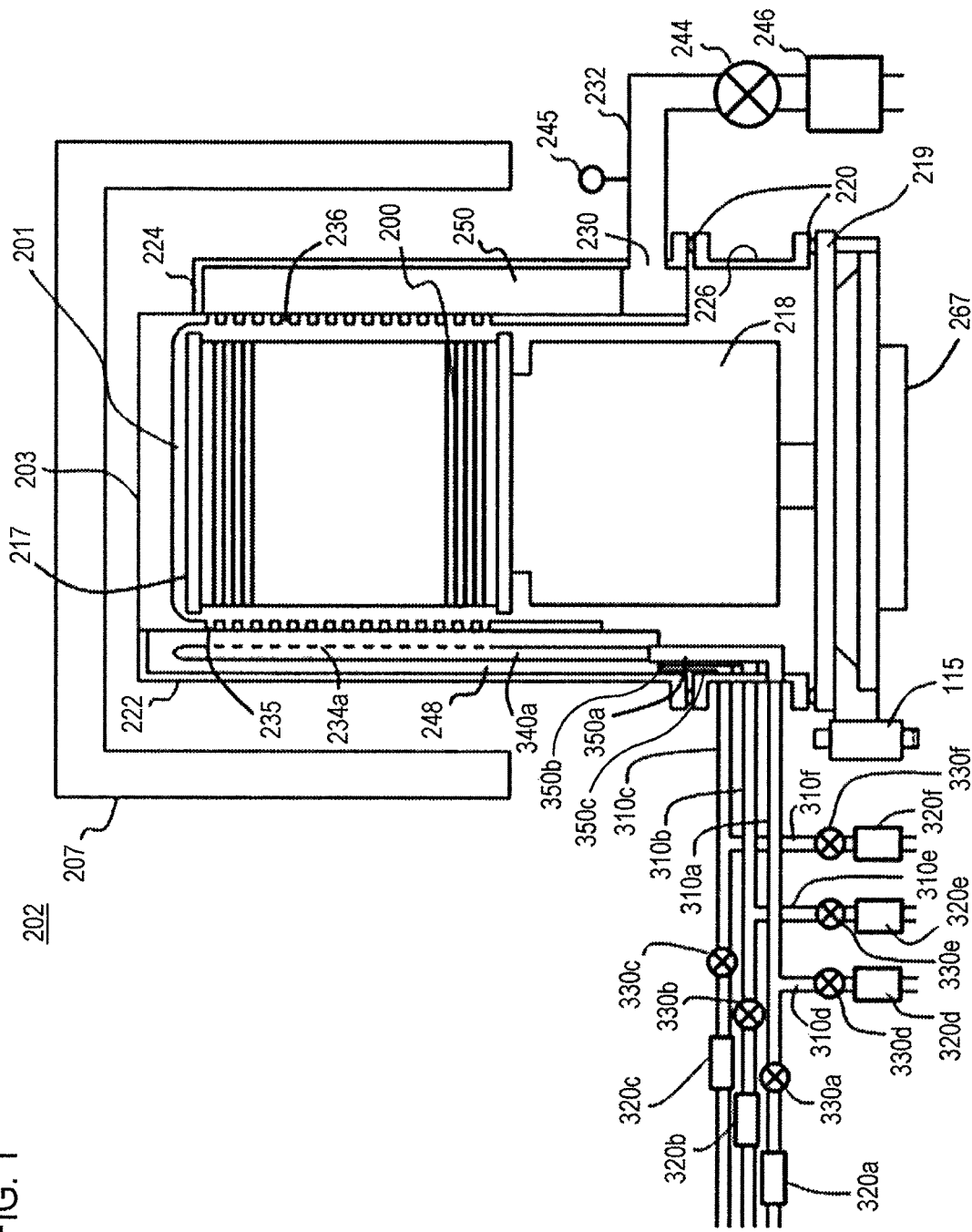
FIG. 1 is a schematic configuration view of a vertical processing furnace of a substrate processing apparatus suitably employed in an embodiment of the present disclosure, in which a portion of the processing furnace is shown in a vertical cross section.

Referring first to FIG. 1, a processing furnace 202 includes a heater 207 as a heating part (heating mechanism). The heater 207 has a cylindrical shape. Although not shown, the heater 207 is configured to include a heater wire and an insulating material. The lower portion of the heater 207 is supported on a heater base (not shown) as a holding plate. Thus, the heater 207 is vertically installed. Furthermore, the heater 207 functions as an activating mechanism (exciting part) which thermally activates (excites) a process gas.

A reaction tube 203 of a single tube structure, which constitutes a reaction vessel (process vessel), is disposed inside the heater 207 in a concentric relationship with the heater 207. The reaction tube 203 is made of a heat-resistant material such as, for example, quartz ($SiO_2$) or silicon carbide (SiC). The reaction tube 203 is formed in a roofed shape with the lower end portion thereof opened and the upper end portion thereof closed by a flat wall. The top end portion (hereinafter also referred to as a ceiling portion) of the reaction tube 203 is formed thick from the viewpoint of securing strength. The sidewall of the reaction tube 203 includes a cylinder portion 209 formed in a cylindrical shape and a gas supply area 222 and a gas exhaust area 224 provided on an outer surface of the cylinder portion 209. A process chamber 201 is formed inside the cylinder portion 209 of the reaction tube 203. The process chamber 201 is configured to process wafers 200 as substrates. Furthermore, the process chamber 201 is configured to accommodate a boat 217 capable of holding the wafers 200 which are arranged in a horizontal posture and in multiple stages along a vertical direction.

The gas supply area 222 is formed such that a convex portion protrudes outward from one sidewall of the cylinder portion 209. An outer wall of the gas supply area 222 is formed outside one sidewall as a portion of the outer surface of the cylinder portion 209 at a size larger than the outer diameter of the cylinder portion 209 and in a concentric relationship with the cylinder portion 209. The gas supply area 222 is formed in a roofed shape with the lower end portion thereof opened and the upper end portion thereof closed by a flat wall. Nozzles 340a to 340c to be described later are accommodated within the gas supply area 222 so as to extend along the longitudinal direction thereof (along the up-down direction). Gas supply slits 235 to be described later are formed in a boundary wall 254 which is a wall that constitutes a boundary between the gas supply area 222 and the cylinder portion 209. The boundary wall 254 is one sidewall of the cylinder portion 209. The outer surface of the boundary wall 254 constitutes a side surface portion that faces the gas supply area 222.

The gas exhaust area 224 is formed on the other sidewall of the cylinder portion 209 opposed to one sidewall on which the gas supply area 222 is formed. The gas exhaust area 224 is disposed such that a region of the process chamber 201, which accommodates the wafers 200, is interposed between the gas supply area 222 and the gas exhaust area 224. The gas exhaust area 224 is formed such that a convex portion protrudes outward from the other sidewall of the cylinder portion 209 opposed to one sidewall on which the gas supply area 222 is formed. An outer wall of the gas exhaust area 224 is formed outside the other sidewall as a portion of the outer surface of the cylinder portion 209 at a size larger than the outer diameter of the cylinder portion 209 and in a concentric relationship with the cylinder portion 209. The gas exhaust area 224 is formed in a roofed shape with the lower end portion and the upper end portion thereof closed by flat walls. Gas exhaust slits 236 to be described later are formed in a boundary wall 252 which is a wall that constitutes a boundary between the gas exhaust area 224 and the cylinder portion 209. The boundary wall 252 is a portion of the cylinder portion 209. The outer surface of the boundary wall 252 constitutes a side surface portion that faces the gas exhaust area 224.

The lower end portion of the reaction tube 203 is supported by a cylindrical manifold 226 serving as a furnace opening portion. The manifold 226 is made of metal such as, for example, nickel alloy or stainless steel, or is made of a heat-resistant material such as, for example, quartz ($SiO_2$) or silicon carbide (SiC). A flange is formed in the upper end portion of the manifold 226. The lower end portion of the reaction tube 203 is installed on and supported by the flange. A seal member 220 such as an O-ring or the like is interposed between the flange and the lower end portion of the reaction tube 203, thereby keeping the interior of the reaction tube 203 in an air-tight state.

A seal cap 219 is air-tightly installed in the lower end opening portion of the manifold 226 through a seal member 220 such as an O-ring or the like, thereby air-tightly closing the lower end opening portion of the reaction tube 203, namely the opening portion of the manifold 226. The seal cap 219 is made of metal such as, for example, nickel alloy or stainless steel, and is formed in a disc shape. The seal cap 219 may be configured such that the outer surface thereof is covered with a heat-resistant material such as quartz ($SiO_2$) or silicon carbide (SiC).

A boat support stand 218 which supports the boat 217 is installed on the seal cap 219. The boat support stand 218 is made of a heat-resistant material such as, for example, quartz or silicon carbide. The boat support stand 218 functions as a thermal insulation part and becomes a support body which supports the boat 217. The boat 217 is erected on the boat support stand 218. The boat 217 is made of a heat-resistant material such as, for example, quartz or silicon carbide. The boat 217 includes a bottom plate (not shown) fixed to the boat support stand 218 and a top plate disposed above the bottom plate. A plurality of posts is installed between the bottom plate and the top plate. A plurality of wafers 200 is held on the boat 217. The wafers 200 are stacked in multiple stages in a tube axis direction of the reaction tube 203 and are supported by the posts of the boat 217 while maintaining a horizontal posture with predetermined gaps left therebetween and the centers thereof aligned with one another.

A boat rotating mechanism 267 which rotates the boat 217 is installed at the opposite side of the seal cap 219 from the process chamber 201. A rotary shaft of the boat rotating mechanism 267, which penetrates the seal cap 219, is connected to the boat support stand 218. The wafers 200 are rotated by rotating the boat 217 through the boat support stand 218 with the boat rotating mechanism 267. The seal cap 219 is vertically moved up and down by the boat elevator 115 as an elevating mechanism installed outside the reaction tube 203. Thus, the boat 217 can be loaded into or unloaded from the process chamber 201.

Nozzle support portions 350a to 350c which support the nozzles 340a to 340c are installed in the manifold 226. The nozzle support portions 350a to 350c are bent in an L-like shape and are installed so as to penetrate the manifold 226. In the present embodiment, there are installed three nozzle support portions 350a to 350c. The nozzle support portions 350a to 350c are made of a material such as, for example, nickel alloy or stainless steel. Gas supply pipes 310a to 310c which supply gases into the reaction tube 203 are respectively connected to one end portions of the nozzle support portions 350a to 350c existing at the side of the reaction tube 203. Furthermore, the nozzles 340a to 340c are respectively connected to the other end portions of the nozzle support portions 350a to 350c. The nozzles 340a to 340c are made of a heat-resistant material such as, for example, quartz or silicon carbide.

The nozzles 340a to 340c are installed along the longitudinal direction of the gas supply area 222 (along the up-down direction) so as to extend from the lower portion toward the upper portion within the gas supply area 222. Each of the nozzles 340a to 340c is configured as an I-shaped long nozzle. Gas supply holes 234a to 234c which supply gases therethrough are respectively formed on the side surfaces of the nozzles 340a to 340c. The gas supply holes 234a to 234c are respectively opened toward the center of the reaction tube 203. As described above, three nozzles 340a to 340c are installed in the gas supply area 222 and are configured to supply plural kinds of gases into the process chamber 201.

In the processing furnace 202 described above, the boat 217 supported by the boat support stand 218 is inserted into the process chamber 201 in a state in which the wafers 200 to be subjected to batch processing are stacked on the boat 217 in multiple stages. The wafers 200 inserted into the process chamber 201 are heated to a predetermined temperature by the heater 207.

A first process gas supply source which supplies a first process gas, a mass flow controller (MFC) 320a which is a flow rate controller (flow rate control part) and a valve 330a which is an opening/closing valve, are respectively installed in the gas supply pipe 310a sequentially from the upstream side. A second process gas supply source which supplies a second process gas, a mass flow controller (MFC) 320b which is a flow rate controller (flow rate control part) and a valve 330b which is an opening/closing valve, are respectively installed in the gas supply pipe 310b sequentially from the upstream side. A third process gas supply source which supplies a third process gas, a mass flow controller (MFC) 320c which is a flow rate controller (flow rate control part) and a valve 330c which is an opening/closing valve, are respectively installed in the gas supply pipe 310c sequentially from the upstream side. Gas supply pipes 310d to 310f which supply an inert gas are respectively connected to the gas supply pipes 310a to 310c at the downstream side of the valves 330a to 330c. Mass flow controllers (MFC) 320d to 320f which are flow rate controllers (flow rate control parts) and valves 330d to 330f which are opening/closing valves, are respectively installed in the gas supply pipes 310d to 310f sequentially from the corresponding upstream sides.

A first process gas supply system is mainly configured by the gas supply pipe 310a, the MFC 320a and the valve 330a. The first process gas supply system may include the first process gas supply source, the nozzle support portion 350a and the nozzle 340a. Furthermore, a second process gas supply system is mainly configured by the gas supply pipe 310b, the MFC 320b and the valve 330b. The second process gas supply system may include the second process gas supply source, the nozzle support portion 350b and the nozzle 340b. Moreover, a third process gas supply system is mainly configured by the gas supply pipe 310c, the MFC 320c and the valve 330c. The third process gas supply system may include the third process gas supply source, the nozzle support portion 350c and the nozzle 340c. As used herein, the term "process gas" may refer to a case of including only a first process gas, a case of including only a second process gas, a case of including only a third process gas, or a case of including the first process gas, the second process gas and the third process gas. Furthermore, as used herein, the term "process gas supply system" may refer to a case of including only a first process gas supply system, a case of including only a second process gas supply system, a case of including only a third process gas supply system, or a case of including the first process gas supply system, the second process gas supply system and the third process gas supply system.

An exhaust port 230 is formed at a lower portion of the gas exhaust area 224. The exhaust port 230 is connected to an exhaust pipe 232. A vacuum pump 246 as a vacuum exhaust device is connected to the exhaust pipe 232 via a pressure sensor 245 as a pressure detector (pressure detection portion), which detects the internal pressure of the process chamber 201, and an auto pressure controller (APC) valve 244 as a pressure regulator (pressure regulation part). The vacuum pump 246 is configured to perform vacuum exhaust so that the internal pressure of the process chamber 201 becomes a predetermined pressure (vacuum level). At the downstream side of the vacuum pump 246, the exhaust pipe 232 is connected to an exhaust gate processing device (not shown) or the like. The APC valve 244 is an opening/closing valve which can perform or stop the vacuum exhaust of the interior of the process chamber 201 by opening or closing the valve and which can regulate the internal pressure of the process chamber 201 by adjusting a valve opening degree and adjusting a conductance. An exhaust system is mainly configured by the exhaust pipe 232, the APC valve 244 and the pressure sensor 245. The exhaust system may include the vacuum pump 246.

Figure 2:
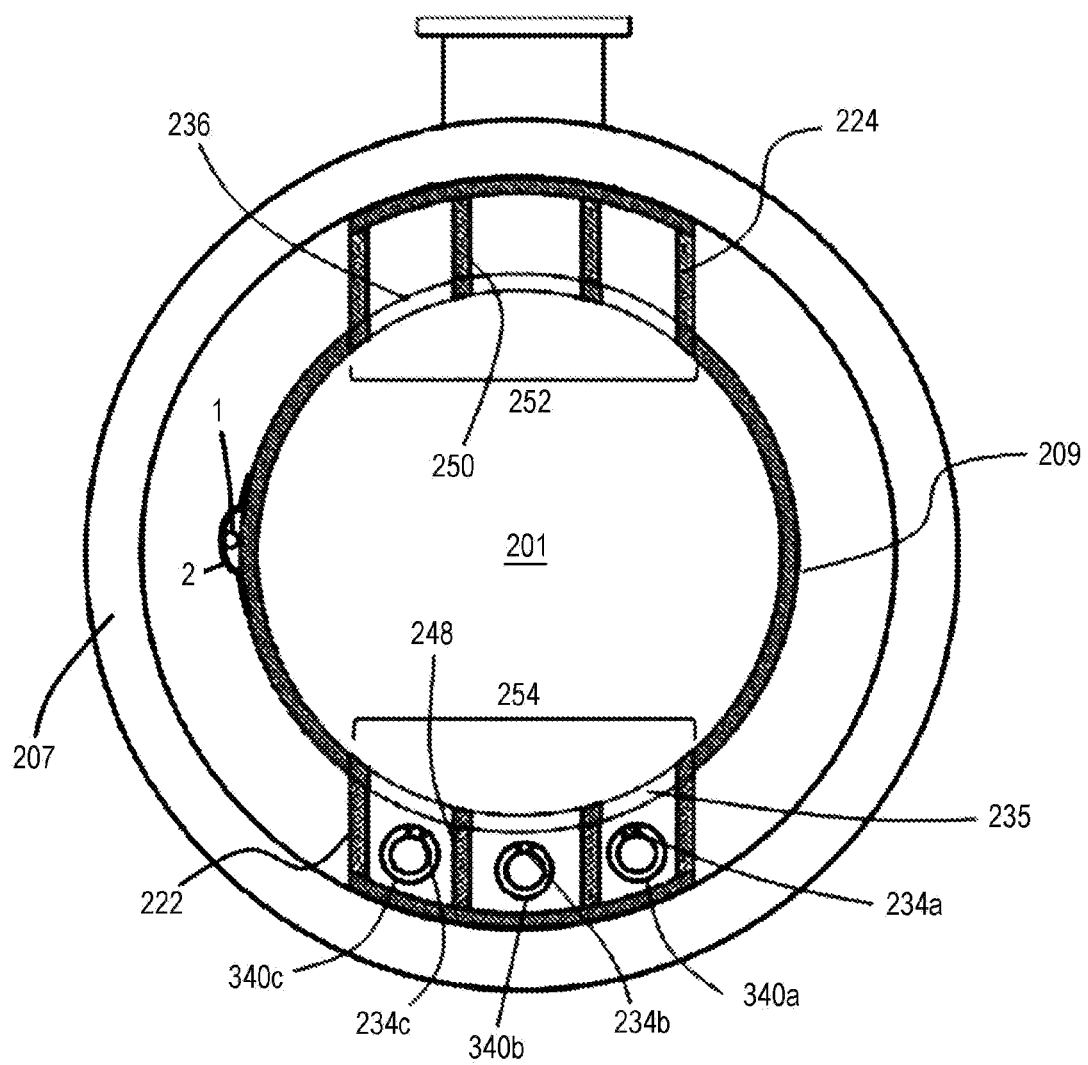
FIG. 2 is a partial schematic configuration view of the vertical processing furnace of the substrate processing apparatus suitably employed in the embodiment of the present disclosure, in which a reaction tube is shown in a horizontal cross section.

As illustrated in FIG. 2, a below-described temperature sensor 1 as a temperature detector (hereinafter also referred to as a "thermocouple") is installed outside the reaction tube 203. By adjusting the electric power supplied to the heater 207 based on temperature information detected by the temperature sensor 1, the internal temperature of the process chamber 201 is adjusted to have a desired or specified temperature distribution.

Figure 3:
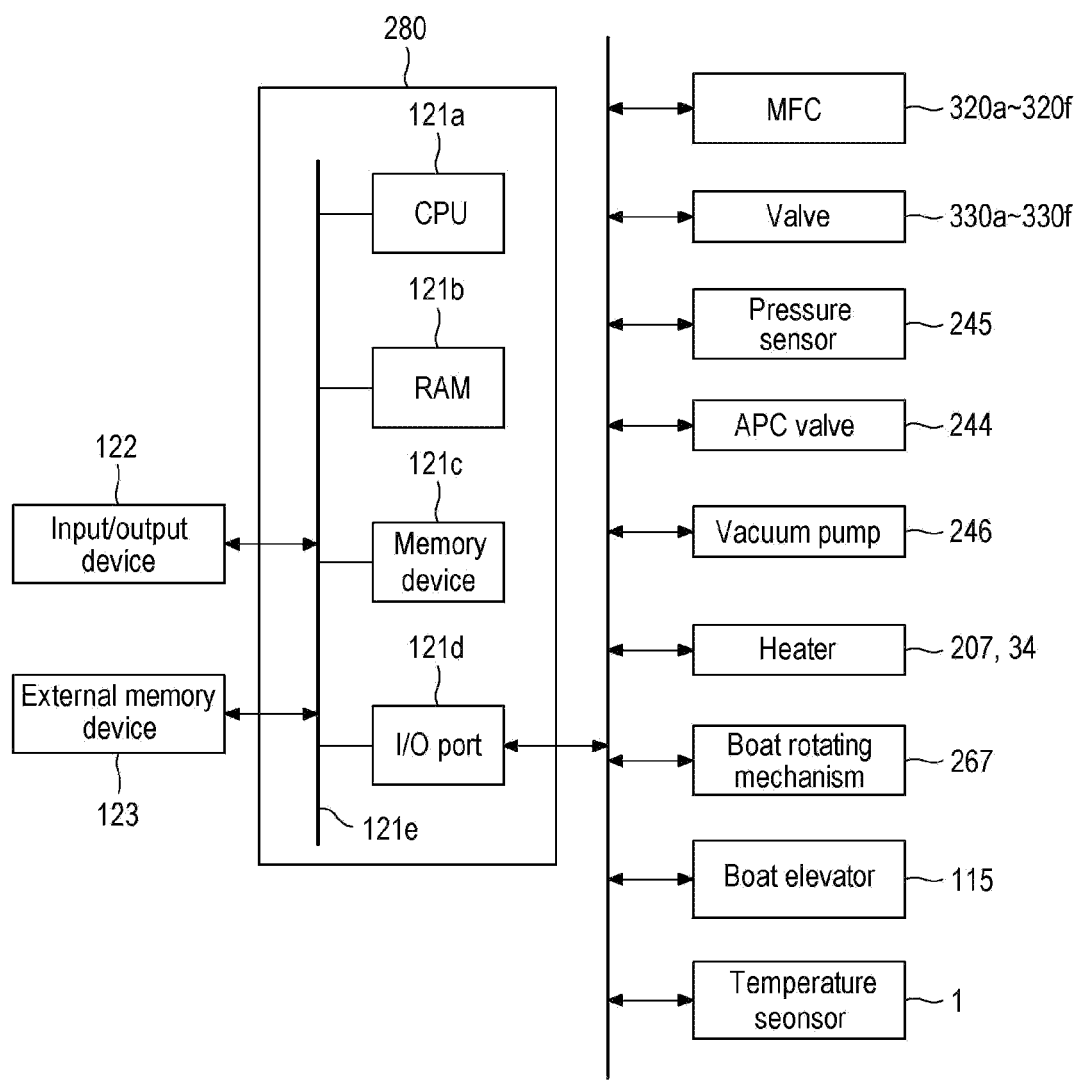
FIG. 3 is a schematic configuration view of a controller of the substrate processing apparatus suitably employed in the embodiment of the present disclosure, in which a control system of the controller is shown in a block diagram.

As illustrated in FIG. 3, a controller 280, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 280.

The memory device 121c is configured by, for example, a flash memory, a hard disc drive (HDD), or the like. A control program for controlling operations of a substrate processing apparatus or a process recipe, in which a sequence or condition of substrate processing to be described later is written, is readably stored in the memory device 121c. The process recipe functions as a program for causing the controller 280 to execute each sequence in the substrate processing procedure, which will be described later, to obtain a predetermined result. Hereinafter, the process recipe and the control program will also be generally and simply referred to as a "program." When the term "program" is used herein, it may refer to a case of including only a process recipe, a case of including only a control program, or a case of including both the process recipe and the control program. The RAM 121b is configured as a memory area (work area) in which a program or data read by the CPU 121a is temporarily stored.

The I/O port 121d is connected to the MFCs 320a to 320f, the valves 330a to 330f, the pressure sensor 245, the APC valve 244, the vacuum pump 246, the heater 207, the temperature sensor (thermocouple) 1, the boat rotating mechanism 267, the boat elevator 115, and the like.

The CPU 121a is configured to read the control program from the memory device 121c and to execute the same. The CPU 121a is also configured to read the process recipe from the memory device 121c according to an input of an operation command from the input/output device 122. The CPU 121a is configured to, according to contents of the process recipe thus read, control the flow rate adjusting operation of various kinds of gases performed by the MFCs 320a to 320f, the opening/closing operation of the valves 330a to 330f, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 1, the operation of rotating the boat 217 with the boat rotating mechanism 267 and adjusting the rotation speed of the boat 217, the operation of moving the boat 217 up and down with the boat elevator 115, and the like.

The controller 280 may be configured by installing into a computer the aforementioned program stored in an external memory device 123 (for example, a magnetic tape, a magnetic disc such as a flexible disc or a hard disc, an optical disc such as a CD or a DVD, a magneto-optical disc such as an MO, or a semiconductor memory such as a USB memory or a memory card). The memory device 121c or the external memory device 123 is configured as a non-transitory computer-readable recording medium. Hereinafter, the memory device 121c and the external memory device 123 will also be generally and simply referred to as a "recording medium." When the term "recording medium" is used herein, it may refer to a case of including only the memory device 121c, a case of including only the external memory device 123, or a case of including both the memory device 121c and the external memory device 123. In addition, the program may be provided to the computer using a communication means such as the Internet or a dedicated line without having to use the external memory device 123.

Next, the shape of the reaction tube 203 will be described with reference to FIGS. 1 and 2.

As illustrated in FIG. 2, inner walls 248 and 250, each of which divide the internal space of each of the gas supply area 222 and the gas exhaust area 224 into a plurality of spaces, are formed within the gas supply area 222 and the gas exhaust area 224. The inner walls 248 and 250 are made of the same material as the reaction tube 203, for example, a heat-resistant material such as quartz ($SiO_2$) or silicon carbide (SiC). In the present embodiment, each of the gas supply area 222 and the gas exhaust area 224 includes two inner walls which divide the internal space of each of the gas supply area 222 and the gas exhaust area 224 into three spaces.

The two inner walls 248 for dividing the interior of the gas supply area 222 are installed to divide the gas supply area 222 over a range extending from the lower end side to the upper end side thereof, thereby forming three isolated spaces. The nozzles 340a to 340c are respectively installed in the respective spaces of the gas supply area 222. Since the respective nozzles 340a to 340c are installed in the independent spaces due to the existence of the inner walls 248, it is possible to prevent the process gases supplied from the respective nozzles 340a to 340c from being mixed within the gas supply area 222. With this configuration, it is possible to suppress mixing of the process gases, formation of thin films and generation of byproducts within the gas supply area 222. The inner walls 248 may be installed to divide the gas supply area 222 over a range extending from the lower end portion to the upper end portion thereof, thereby forming three isolated spaces.

The two inner walls 250 for dividing the interior of the gas exhaust area 224 are installed to divide the gas exhaust area 224 over a range extending from the lower end side to the upper end side thereof, thereby forming three isolated spaces. The inner walls 250 may be installed to divide the gas exhaust area 224 over a range extending from the lower end side to the upper end portion thereof, thereby forming three isolated spaces. If the outer diameters of the outer walls of the gas supply area 222 and the gas exhaust area 224 are set to have the same dimension, there is provided a merit in that it is possible to reduce a dead space generated between the heater 207 and the outer walls of the gas supply area 222 and the gas exhaust area 224. The cross-sectional areas of gas flow paths of the gas supply area 222 and the gas exhaust area 224 may be set to become equal to each other. The cross-sectional areas of gas flow paths of the respective spaces within the gas supply area 222 may be set to become equal to the cross-sectional areas of gas flow paths of the respective spaces within the gas exhaust area 224, which are opposed to the respective spaces within the gas supply area 222.

The inner walls 250 within the gas exhaust area 224 are formed to extend from the upper end portion of a ceiling of the gas exhaust area 224 to a position higher than the upper end portion of the exhaust port 230 existing at the lower end side of the gas exhaust area 224. A single space is formed over a region extending from the position higher than the upper end portion of the exhaust port 230 existing at the lower end side of the gas exhaust area 224 to the lower end portion of the gas exhaust area 224. The gases flowing through the respective spaces of the gas exhaust area 224 divided by the inner walls 250 are merged in the single space existing in front of the exhaust port 230 and are exhausted from the exhaust port 230.

The inner walls 248 within the gas supply area 222 are formed to extend from a ceiling of the gas supply area 222 to the upper portion of the lower end portion of the reaction tube 203. Specifically, the lower end portions of the inner walls 248 are formed to extend to the lower side of the upper end portion of an opening portion. The lower end portions of the inner walls 248 are formed in a region existing at the upper side of the lower end portion of the reaction tube 203 and existing at the lower side of the upper end portions of the nozzle support portions 350a to 350c. The length of the inner walls 248 within the gas supply area 222 is shorter than the length of the reaction tube 203 and is longer than the length of the boundary wall 254. Furthermore, the inner walls 248 within the gas supply area 222 are longer than the inner walls 250 within the gas exhaust area 224.

The gas supply holes 234a to 234c of the nozzles 340a to 340c may be formed in alignment with the central regions of the vertical widths of the respective gas supply slits 235 so as to correspond, one by one, to the respective gas supply slits 235. For example, when there are formed twenty five gas supply slits 235, twenty five gas supply holes 234a, twenty five gas supply holes 234b and twenty five gas supply holes 234c may be formed. That is to say, the gas supply slits 235 and the gas supply holes 234a to 234c may be formed in the same number as the wafers 200. By employing this slit configuration, process gas streams parallel to the wafers 200 can be formed on the wafers 200.

Furthermore, the gas exhaust slits 236 extending in the circumferential direction are formed in the gas exhaust area 224. It is therefore possible to perform exhaust without disturbing the process gas streams flowing on the wafers 200. In the present embodiment, the gas exhaust slits 236 are formed in a horizontally elongated shape. Thus, there is no possibility that concentrated process gas streams are formed near the exhaust side. It is possible to straighten the streams on the wafers 200 and to uniformly supply the process gases.

As illustrated in FIG. 2, the thermocouple 1 used as a control-purpose thermocouple (control-purpose TC) is attached to the outer side of the reaction tube 203 (the cylinder portion 209) by a cover 2 as a protective member. While not shown in the drawings, the cover 2 is formed of a quartz member to be described later. In the present embodiment, the thermocouple 1 is attached to the outer side of the process chamber 201 and is installed so as to face the heater 207 as a heating part. Accordingly, it is possible to solve the problem (delay of temperature responsiveness) which is posed when the thermocouple 1 is installed inside the reaction tube 203. Since the thermocouple 1 according to the present embodiment is fixed to the reaction tube 203 by the cover 2, it is possible to suppress the risk of the thermocouple 1 itself being damaged due to a disaster such as an earthquake or the like. While only one thermocouple 1 is shown in FIG. 2, there may be provided a plurality of thermocouples 1. A cushioning member to be described later may be installed between the thermocouple 1 and the reaction tube 203. While the thermocouple 1 illustrated in FIG. 2 is installed on the sidewall of the reaction tube 203, the thermocouple 1 may be installed in the ceiling portion of the reaction tube 203 as will be described later.

Figure 4:
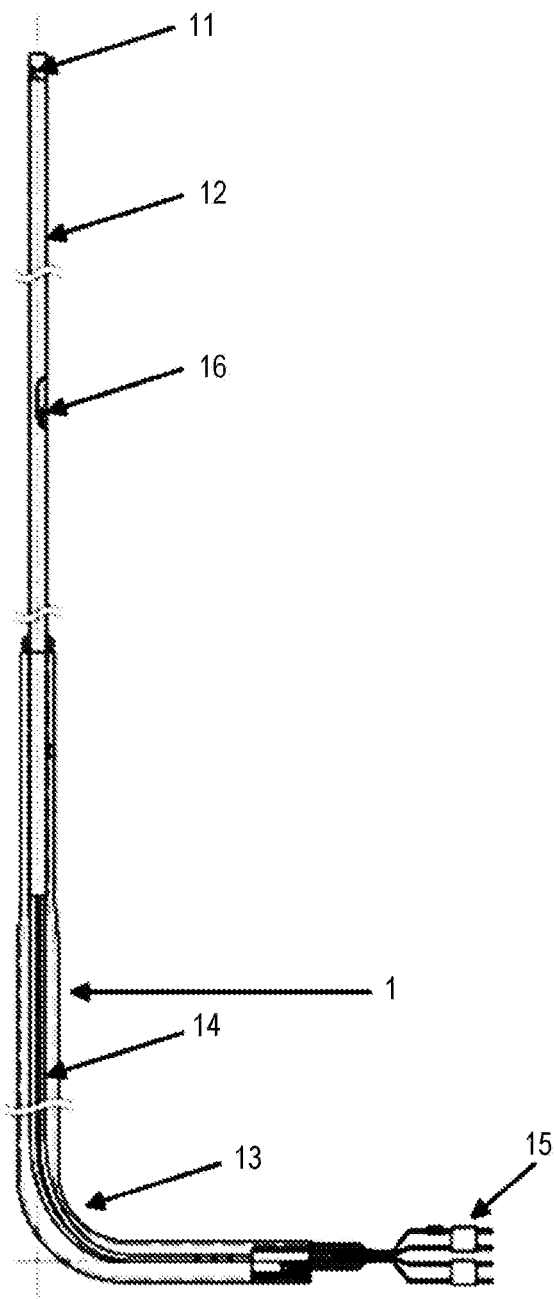
FIG. 4 is a schematic configuration view of a thermocouple attached to the reaction tube of the substrate processing apparatus suitably employed in a first embodiment of the present disclosure.

Next, the thermocouple 1 as a temperature detection part will be described with reference to FIGS. 4, 5A, 5B and 13. As illustrated in FIG. 4, the thermocouple 1 is configured to include a temperature measuring portion 11 (16) configured to measure the internal temperature of the reaction tube 203, an insulation pipe 12 as a main body portion provided therein with a thermocouple wire 14 which constitutes the temperature measuring portion, a protective tube 13 connected to the main body portion 12 at the lower side of the temperature detection part and configured to protect the thermocouple wire 14, and a connector 15 as an acquisition portion connected to the thermocouple wire 14 and configured to acquire the temperature measured by the temperature measuring portion. The thermocouple 1 is based on the aforementioned configuration.

The entirety of the thermocouple 1 is not covered with a quartz-made protective tube which has been a cause of generation of particles in the related art. The vicinity of the temperature measuring portion is covered with the insulation pipe 12 as a main body portion (made of, for example, alumina). The diameter of the insulation pipe 12 having a cylindrical shape is about 4 mm to 6 mm. Hollow holes for allowing the thermocouple wire 14 to pass therethrough are formed at four points in the insulation pipe 12. The thermocouple wire 14 passes through the hollow holes. The distal end portion (hereinafter also referred to as a temperature measuring point) as a contact point of the thermocouple wire 14 as the temperature measuring portion protrudes from at least the insulation pipe 12. As mentioned above, the temperature measuring portion 11 (16) for sensing a temperature is not covered with a quartz-made protective tube. Thus, it becomes easy to directly sense thermal energy. That is to say, the sensitivity of the thermocouple 1 is improved. The temperature measuring portion 11 (16) is installed at the distal end of the thermocouple wire 14. In the present embodiment, the temperature measuring portion 11 (16) is divided into two zones, namely a thermocouple distal end upper zone 11 as a first temperature measuring portion and a thermocouple distal end lower zone 16 as a second temperature measuring portion.

Figure 5A:
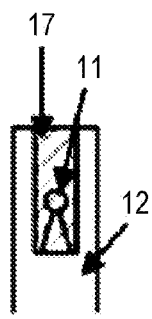
FIGS. 5A and 5B are detail views in which a temperature measuring portion of the thermocouple suitably employed in the embodiment of the present disclosure is enlarged.
Figure 5B:
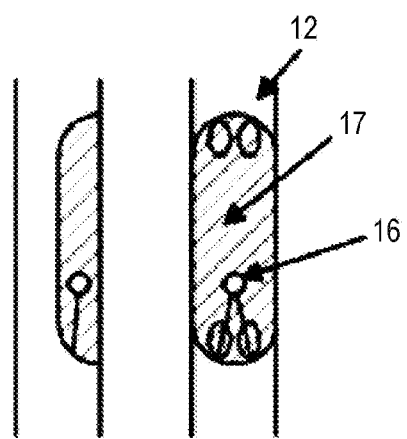

Specifically, as illustrated in FIG. 5A, the insulation pipe 12 is configured to include a cutout portion formed by cutting a portion of the distal end portion thereof in the circumferential direction. The first temperature measuring portion 11 is disposed in the cutout portion. The portion hatched in FIG. 5A substantially corresponds to the cutout portion. Alumina cement 17 as an adhesive agent is spread on the cutout portion so as to bond the first temperature measuring portion 11 to the inner surface of the insulation pipe 12. That is to say, the first temperature measuring portion 11 is fixed to the inner surface of the insulation pipe 12 by the bonding force of the alumina cement 17. As illustrated in FIG. 5B, a halfway cutout portion formed by cutting a portion of a halfway portion of the insulation pipe 12 in the circumferential direction is formed in the halfway portion of the insulation pipe 12. The second temperature measuring portion 16 is disposed in the halfway cutout portion. The portion hatched in FIG. 5B substantially corresponds to the halfway cutout portion. Alumina cement 17 is spread on the halfway cutout portion so as to bond the second temperature measuring portion 16 to the inner surface of the insulation pipe 12. That is to say, the second temperature measuring portion 16 is fixed to the inner surface of the insulation pipe 12 by the bonding force of the alumina cement 17.

Figure 13:
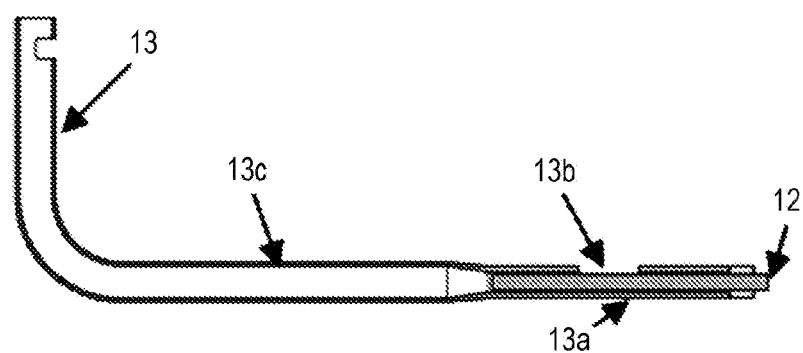
FIG. 13 is a view illustrating details of a protective tube suitably employed in the embodiment of the present disclosure.

Furthermore, the protective tube 13 (made of, for example, quartz) is installed under the insulation pipe 12 (the thermocouple 1). The protective tube 13 is installed in the furnace opening portion 226. In the present embodiment, in order to install the protective tube 13 in the furnace opening portion 226, the insulation pipe 12 is installed to linearly extend in the longitudinal direction of the reaction tube 203 and the protective tube 13 is formed in an L-like shape. One of the merits of this configuration is as follows. The insulation pipe 12 is often made of a hard-to-bend material such as alumina or the like. Therefore, instead of the insulation pipe 12, the protective tube 13 made of quartz is disposed in the vicinity of the furnace opening portion 226. This makes it easy to process the protective tube 13. The protective tube 13 is formed such that the outer diameter of one end portion of the protective tube 13, to which the insulation pipe 12 is attached, becomes smaller than the outer diameter of the other end portion of the protective tube 13 (to which the insulation pipe 12 is not attached). In FIG. 13, the protective tube 13 is illustrated in detail. The protective tube 13 includes three portions, namely a connection portion 13a connected to the insulation pipe 12, a bonding portion 13b on which the alumina cement 17 as an adhesive agent is coated to fix the insulation pipe 12 to the protective tube 13, and a protective portion 13c formed in an L-like shape to attach the protective tube 13 to the furnace opening portion 226. The inner diameter of the connection portion 13a is set to become smaller than the inner diameter of the protective portion 13c. That is to say, the protective tube 13 is formed such that the inner diameter of one end portion (the inner diameter of the connection portion 13a) of the protective tube 13, to which the insulation pipe 12 is attached, becomes smaller than the inner diameter of the other end portion (the inner diameter of the protective portion 13c) of the protective tube 13 (to which the insulation pipe 12 is not attached). The inner diameter of the connection portion 13a is kept substantially constant so as to define a region in which at least the insulation pipe 12 is inserted into and installed in the protective tube 13. The protective tube 13 is formed such that the inner diameter of the region, in which the insulation pipe 12 is installed, becomes smaller than the inner diameter of a region other than the region in which the insulation pipe 12 is installed. Furthermore, the protective tube 13 is formed such that the outer diameter of the region, in which the insulation pipe 12 is installed, becomes smaller than the outer diameter of a region other than the region in which the insulation pipe 12 is installed. This makes it possible to enlarge the space defined within the protective tube 13 (the protective portion 13c). The thermocouple 1 has a characteristic of extending in the longitudinal direction due to thermal expansion. However, the thermocouple 1 is playable due to the existence of the space defined within the protective tube 13 (the protective portion 13c). It is therefore possible to suppress the breakage of the thermocouple 1. In the protective tube 13, an opening as the bonding portion 13b is formed in a halfway portion of one end portion to which the insulation pipe 12 is attached. Use of the opening makes it possible to spread the alumina cement 17 so as to adhere to the outer surface of the insulation pipe 12 and the inner surface of the connection portion 13a. By spreading the alumina cement 17, it is possible to reliably fix the insulation pipe 12 to the protective tube 13. Particularly, if the temperature measuring portion is position-shifted when detecting a temperature, the controllability of the internal temperature of the process chamber 201 may be adversely affected and the temperature reproducibility may be deteriorated. This may lead to a big problem in that it becomes impossible to form predetermined films on the wafers 200. By reliably fixing the insulation pipe 12 to the protective tube 13 in the aforementioned manner, it is possible to suppress occurrence of this problem. The opening may be opened toward the side toward which the other end portion of an L-shape of the protective tube 13 extends. This makes it possible to improve the workability when spreading the alumina cement 17.

The thermocouple wire 14 is connected to the connector 15 outside the furnace opening portion 226. Temperature data are output from the connector 15 to a temperature controller not shown in the drawings. Furthermore, an opening may also be formed in the other end portion of the protective tube 13, namely in the halfway portion existing at the side at which the thermocouple wire 14 is connected to the connector 15. Use of this opening makes it possible to spread the alumina cement 17 so as to adhere to the outer surface of the thermocouple wire 14 and the inner surface of the protective tube 13. By doing so, it is possible to allow the thermocouple 1 to play in response to thermal expansion. Furthermore, it becomes easy to fix the connector 15 or the like. This makes it possible to suppress occurrence of a problem of the connector 15 being removed or a problem of the thermocouple wire 14 being broken.

The basic configuration of the thermocouple 1 installed on the sidewall of the reaction tube 203 remains the same in the second to fourth embodiments to be described later, although the outward configuration of the thermocouple 1 may vary due to the difference in the position or location in which the temperature measuring portion 11 (16) is installed. Thus, if the configuration of the thermocouple 1 remains the same, descriptions thereof will be omitted herein below.

Figure 6:
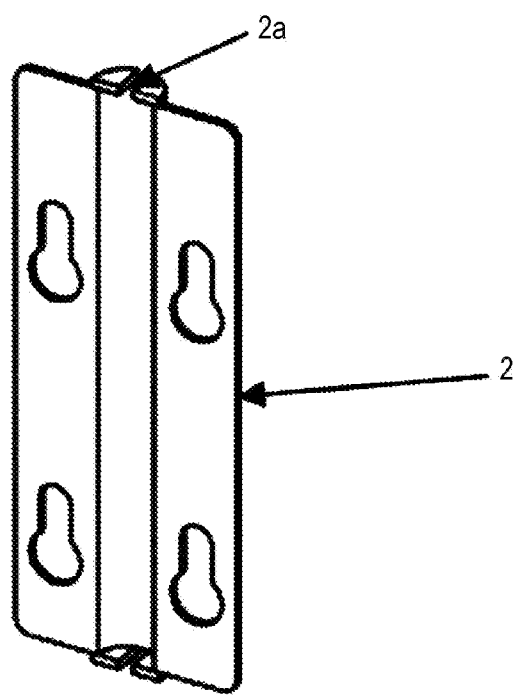
FIG. 6 is a view illustrating one example of a cover suitably employed in the first embodiment of the present disclosure.

FIG. 6 illustrates the quartz-made cover 2 according to the present embodiment. Clamping portions 2a are formed in the upper and lower end portions of the cover 2. The width of the clamping portions 2a is substantially equal to the diameter of the insulation pipe 12. The insulation pipe 12 is inserted to the clamping portions 2a. This makes it possible to perform the positioning of the thermocouple 1. When fixing the thermocouple 1, a semi-cylindrical space is formed in the cover 2. In addition to the thermocouple 1, a below-described thermal insulator 3 may be inserted into the semi-cylindrical space. If the thermocouple 1 is moved from the interior of the reaction tube 203 to the outside thereof, the temperature measuring point (the temperature measuring portion in the present embodiment) of the thermocouple 1 comes close to a heater wire. Thus, the temperature increasing/decreasing characteristic may be changed. For that reason, in order to make it difficult for the temperature measuring point of the thermocouple 1 to receive thermal energy from the heater wire, there is provided a configuration in which the thermocouple 1 can be covered with the cover 2 and the below-described thermal insulator 3.

Figure 7:
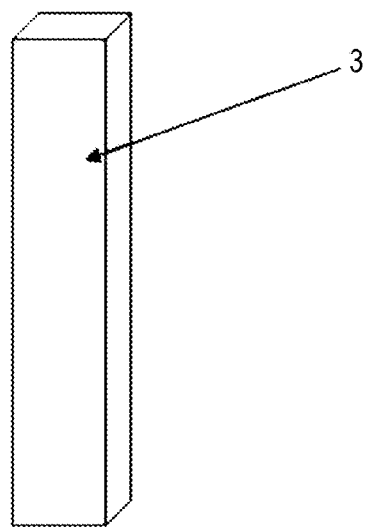
FIG. 7 is a view illustrating one example of a thermal insulator suitably employed in the first embodiment of the present disclosure.

FIG. 7 illustrates one example of the thermal insulator 3 suitably employed in the present embodiment. The heater 207 is divided into a plurality of regions (zones). Thus, it is necessary to change the amount of heat applied to the wafers 200 on a zone-by-zone basis. For that reason, the thermal insulator 3 is configured such that the thickness of the thermal insulator 3 can be changed on a zone-by-zone basis. If the thermal insulator 3 is made thick, the temperature of the thermocouple 1 is difficult to increase. Thus, the output from the heater 207 becomes larger. For that reason, if the temperature increasing characteristic of the heater 207 is high, the thermal insulator 3 may be omitted. Since the temperature of the wafers 200 is rapidly increased by the radiation heat generated from the heater 207, it is not necessary to adjust the temperature increasing speed to become fast using the thermal insulator 3.

However, in the case of using a rapid cooling mechanism provided in a vertical apparatus, a cooling air passes through between the reaction tube 203 and the cover 2. The thermocouple disposed between the reaction tube 203 and the cover 2 indicates the temperature of the cooling air. It is therefore necessary to install a thermal insulator at the upstream side of the air flow in order to cut off the cooling air. In this regard, descriptions will be made later.

Figure 8A:
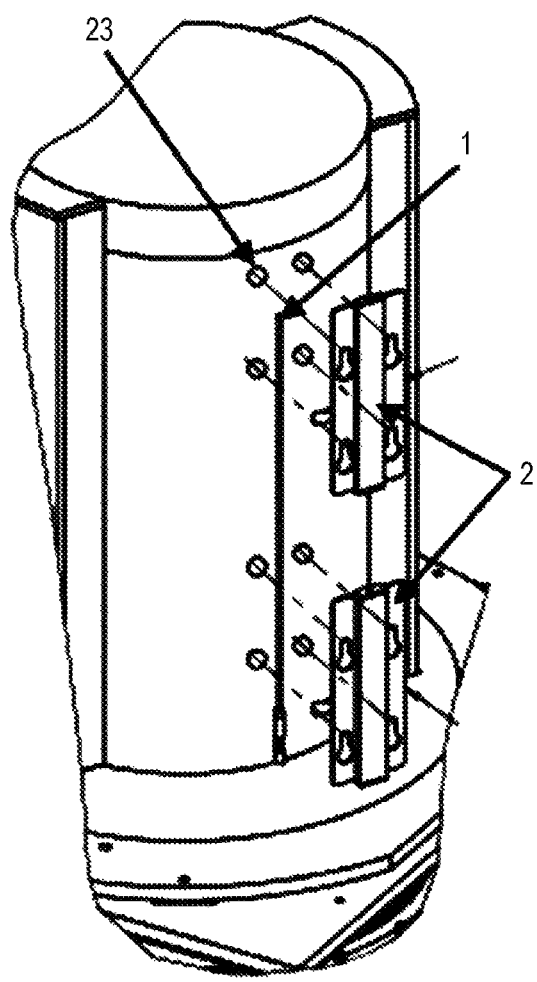
FIG. 8A is a schematic view illustrating a state in which the thermocouple is being attached to the outside of the reaction tube suitably employed in the first embodiment of the present disclosure.

Next, the attachment of the thermocouple 1 to the reaction tube 203 will be described with reference to FIGS. 8A and 8B.

In the present embodiment, the thermocouple 1 is attached to the outside of the reaction tube 203 using the cover 2. As illustrated in FIG. 8A, pins 23 prepared in advance are disposed on the outer surface of the reaction tube 203. Holes (fixing holes) are prepared in advance in the cover 2 so that the holes engage with the pins 23. In the present embodiment, the pins 23 are made of quartz. Specifically, the pins 23 and the holes formed in the cover 2 are respectively four in number. The cover 2 is fixed at four points by bringing the fixing holes into engagement with the pins 23. The reason for employing such a hanging structure is to make sure that the thermocouple wire 14 of the first temperature measuring portion 11 and the second temperature measuring portion 16 is not broken by the thermal expansion and contraction thereof. Specifically, by employing the hanging structure, the thermal expansion direction of the thermocouple wire 14 is limited to the ground surface direction. Thus, there is no variation in the extension of the thermocouple wire 14. This eliminates the breakage risk of the thermocouple wire 14. In the present embodiment, the cover 2 and the pins 23 are used as a first fixing jig for fixing the thermocouple 1 to the reaction tube 203. This structure holds true in all the full covers 2 which will be described later.

Figure 8B:
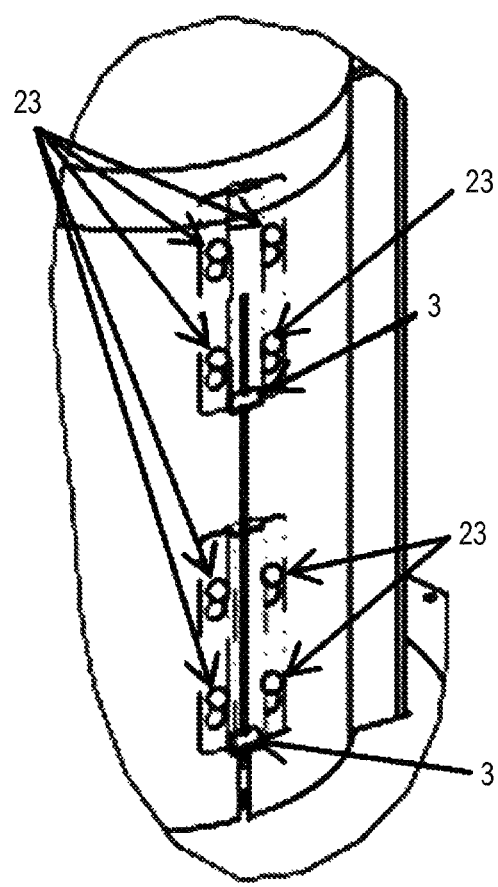
FIG. 8B is a schematic view illustrating the internal shape of protective members after the thermocouple is attached to the outside of the reaction tube suitably employed in the first embodiment of the present disclosure.

As can be seen in FIG. 8B illustrating a state in which the pins 23 have been brought into engagement with the holes and the cover 2 has been fixed to the reaction tube 203 so as to suspend from the reaction tube 203, the first temperature measuring portion 11 (the distal end of the thermocouple wire 14) is disposed at the center of the cover 2. Similarly, although not clear in FIG. 8B, the second temperature measuring portion 16 is also disposed at the center of the cover 2. In the present embodiment, the temperature measuring portions are provided at two points. Thus, the covers 2 as first fixing jigs are prepared in the same number (two) as the temperature measuring portions.

As illustrated in FIG. 8B, the thermal insulator 3 is disposed in the cylindrical space defined in the cover 2 (in the lower portion of the cover 2). This is to restrain the thermocouple 1 from being affected by the coolant which cools the heater 207 disposed to face the cover 2. Specifically, if the coolant for rapid cooling is supplied to the heater 207, due to the hanging structure of the cover 2, the coolant for rapid cooling is also supplied to the first temperature measuring portion 11 (or the second temperature measuring portion 16) as a temperature measuring part. For that reason, it may be considered that the first temperature measuring portion 11 (or the second temperature measuring portion 16) for detecting the internal temperature of the reaction tube 203 performs heater-control using the temperature of the coolant. Thus, the thermal insulator 3 is installed in the lower portion of the cover 2, thereby suppressing the influence of the coolant and suppressing the erroneous detection of the first temperature measuring portion 11 (or the second temperature measuring portion 16). Furthermore, the first temperature measuring portion 11 (or the second temperature measuring portion 16) is disposed at the center of the cover 2 in view of the influence of the coolant. The thermal insulator 3 may be included in the first fixing jig.

Figure 9:
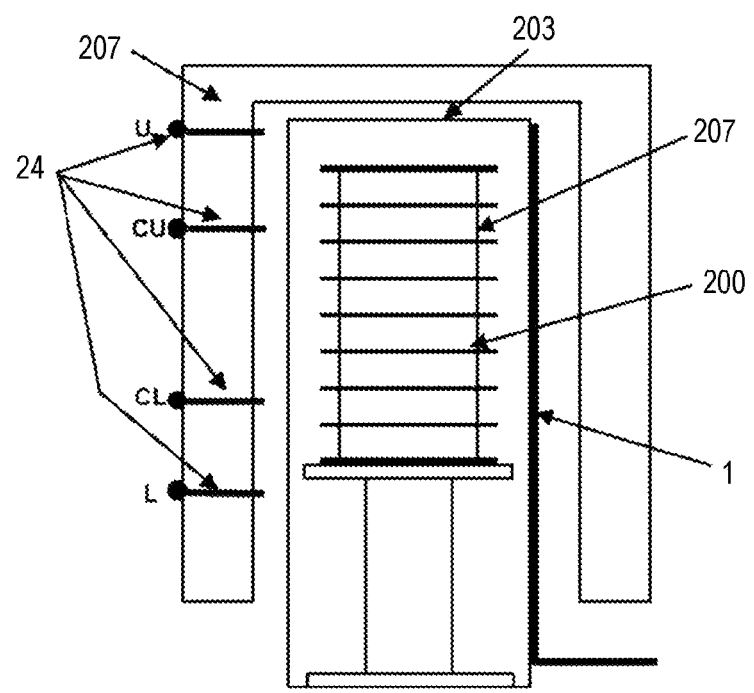
FIG. 9 is a schematic configuration view of the vertical processing furnace of the substrate processing apparatus suitably employed in the embodiment of the present disclosure, in which a portion of the processing furnace is shown in a vertical cross section when the thermocouple is attached to the outside of the reaction tube.

As illustrated in FIG. 9, the heater 207 of the vertical apparatus is divided into a plurality of zones and is controlled on a zone-by-zone basis. Accordingly, the number of the temperature measuring portions 11 (16) of the thermocouple 1 need to be equal to the number of the zones of the heater 207. However, due to its structure, the thermocouple 1 according to the present embodiment has only two temperature measuring portions corresponding to two zones. Thus, if a heater has two or more zones, a plurality of thermocouples 1 is installed. For example, if the number of heater zones is four, two thermocouples 1 are installed. If the number of heater zones is five, three thermocouples 1 are installed.

As illustrated in FIG. 9, the thermocouple 1 attached to the outside of the reaction tube 203 and the heater 207 as a heating part, are configured to face each other. The heater 207 is divided into four temperature control zones (a U zone, a CU zone, a CL zone and an L zone). Heater thermocouples 24 are installed in the respective zones.

The heater 207 is disposed so as to surround the reaction tube 203 and is configured to heat a plurality of wafers 200 held on the boat 217 existing within the reaction tube 203 to a predetermined temperature.

Figure 10:
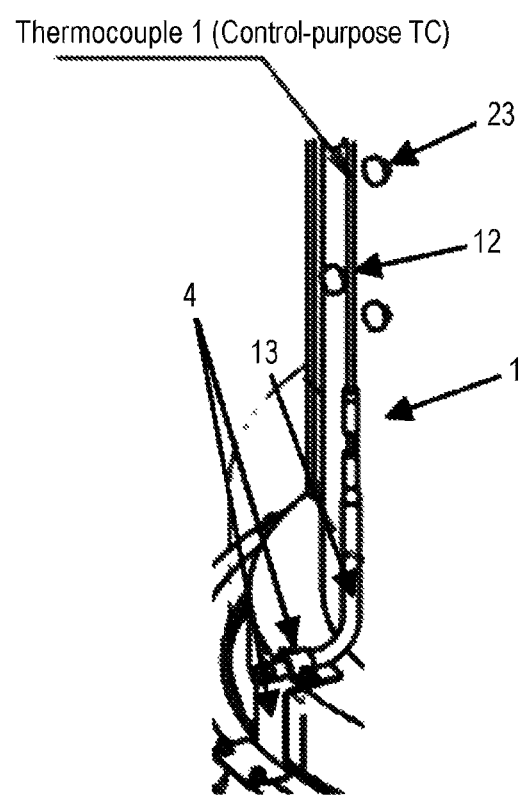
FIG. 10 is a schematic view illustrating a state in which the thermocouple is being installed in a furnace opening portion suitably employed in the embodiment of the present disclosure.

In FIG. 10, there is illustrated a configuration in which the thermocouple 1 is attached to the furnace opening portion 226 by a jig for attaching the thermocouple (thermocouple attaching jig) 4 as a second fixing jig. The jig 4 is made of quartz. As described above, the thermocouple 1 is attached to a plurality of points including the reaction tube 203 and the furnace opening portion 226 by the first fixing jig and the second fixing jig. With this configuration, it is eventually possible to hold the thermocouple 1 at two or more points.

This makes it possible to reduce the risk of the thermocouple 1 being broken by an earthquake or the like. For example, the thermocouple 1 has the strength capable of withstanding an earthquake intensity of about 300 Gal.

Figure 11:
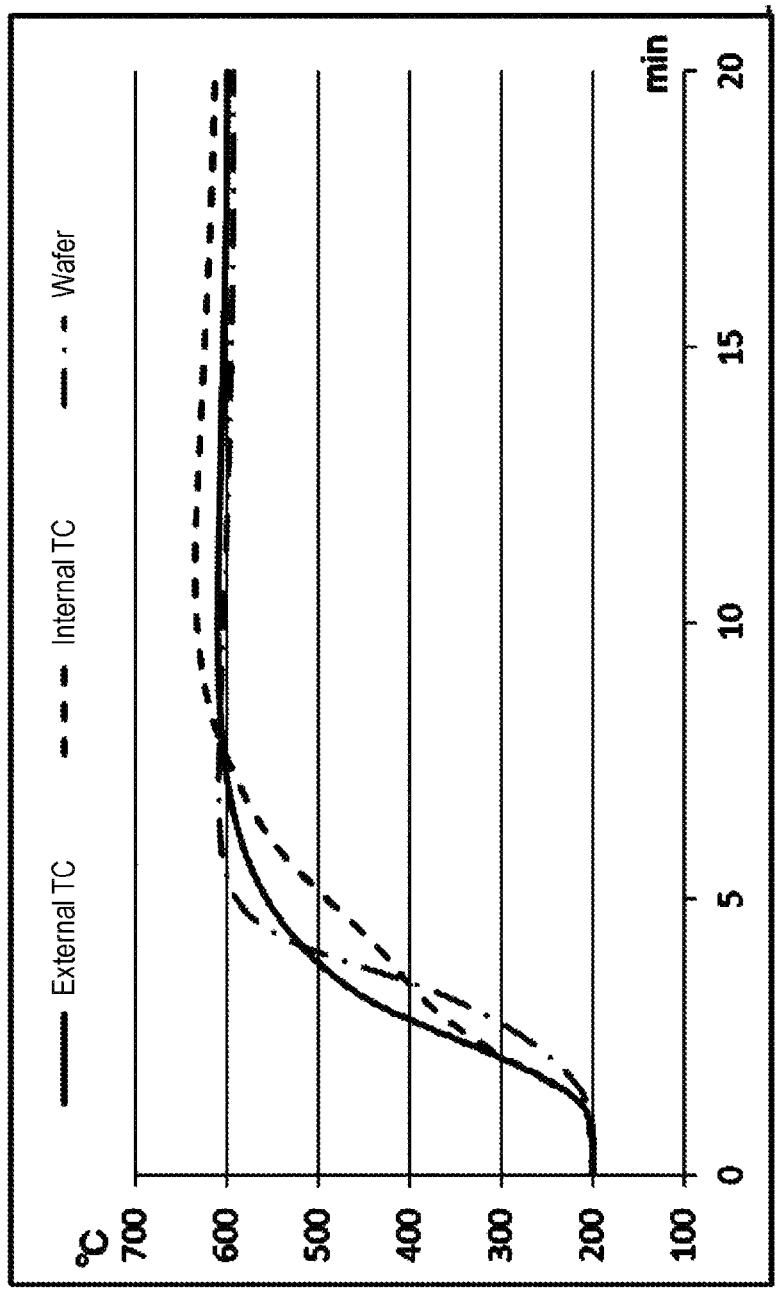
FIG. 11 is a schematic view showing a comparison of temperature characteristics available when a thermocouple of a related art is installed inside the reaction tube and when the thermocouple suitably employed in the embodiment of the present disclosure is attached to the outside of the reaction tube.

FIG. 11 is a graph illustrating changes of temperatures which are respectively measured by the temperature measuring portion of the thermocouple (wafer TC) attached to the surface of the wafer 200, the temperature measuring portion of the thermocouple 1 (external TC) of the present embodiment attached to the outside of the reaction tube 203, and the temperature measuring portion of the thermocouple of related art (internal TC) attached to the inside of the reaction tube 203, when the internal temperature of the processing furnace 202 is increased from 200 degrees C. to 600 degrees C. In this graph, the vertical axis indicates the temperature and the horizontal axis indicates the time.

If the thermocouple 1 of the present embodiment is moved from the interior of the reaction tube 203 to the outside thereof, the temperature measuring point of the thermocouple 1 comes close to a heater wire. Thus, the temperature increasing/decreasing characteristic is changed. This is because the thermocouple 1 disposed outside the reaction tube 203 comes close to the heater 207 and because the attenuation of radiation heat from the reaction tube 203 remain small. It is well-known through experiments or the like that in the case of a heater having a high temperature increasing characteristic, the temperature increasing speed of the wafer 200 is higher than the temperature increasing speed of the thermocouple 1 disposed inside the reaction tube 203.

As shown in FIG. 11, when the internal temperature of the processing furnace 202 is increased from 200 degrees C. to 600 degrees C. (during the time period of about 8 minutes from the measurement start time), the temperature increasing characteristic of the wafer 200 is similar to the temperature increasing characteristic of the thermocouple 1 installed outside the reaction tube 203. However, it can be noted that the temperature increasing characteristic of the thermocouple 1 installed inside the reaction tube 203 is shifted downward. Thus, it can be clearly understood that in the case of a heater having a high temperature increasing characteristic, it is advantageous to install the thermocouple 1 outside the reaction tube 203 in order for the temperature increasing characteristic of the thermocouple 1 to come close to the temperature increasing characteristic of the wafer 200.

As shown in FIG. 11, when the temperature characteristics available after increasing the temperature to 600 degrees C. are compared, it can be noted that the temperature characteristic of the wafer 200 is identical with the temperature characteristic of the thermocouple 1 (external TC) installed outside the reaction tube 203. Checking the error from the preset temperature (600 degrees C. in the present embodiment), it can be clearly noted that it is advantageous to install the thermocouple 1 outside the reaction tube 203. Furthermore, as can be seen in FIG. 11, the thermocouple 1 (internal TC) installed inside the reaction tube 203 fails to reach the preset temperature (600 degrees C.) even after 20 minutes are elapsed from the measurement start time. In contrast, the temperature measured by the thermocouple 1 installed outside the reaction tube 203 converges nearly to the preset temperature (600 degrees C.) after 10 minutes.

As shown in FIG. 11, when the internal temperature of the processing furnace 202 is increased from 200 degrees C. to 600 degrees C., the temperature characteristic of the wafer 200 and the temperature characteristic of the thermocouple 1 (external TC) of the present embodiment installed outside the reaction tube 203 are similar to each other. In particular, the time required in converging to 600 degrees C. (the time required in stabilizing the temperature) remains substantially the same. Furthermore, the temperature at the time of convergence to 600 degrees C. (or the error from the preset temperature) remains substantially the same. Therefore, as compared with a case where a temperature is detected by the thermocouple 1 (internal TC) installed inside the reaction tube 203, it is possible to shorten the time required in increasing the temperature from a standby temperature to a film forming temperature and in stabilizing the increased temperature at the film forming temperature, for example, in a substrate processing process. Thus, the improvement of throughput can be expected. Since the temperature at the time of convergence to the preset temperature (600 degrees C.) remains substantially the same, the improvement of a substrate quality can be expected.

Next, descriptions will be made on the overview of the operation of the substrate processing apparatus according to the present disclosure. The substrate processing apparatus is controlled by the controller 280.

The boat 217 holding a predetermined number of wafers 200 is inserted into the reaction tube 203. The reaction tube 203 is air-tightly closed by the seal cap 219. Within the air-tightly closed reaction tube 203, the wafers 200 are heated and maintained at a predetermined temperature. A process gas is supplied into the reaction tube 203. The wafers 200 are subjected to a heat treatment such as heating or the like.

In a heat treatment, for example, a film forming process according to the present embodiment, an SiN film is formed on the wafer 200 by performing, a predetermined number of times (once or more), a cycle which non-simultaneously performs: a step of supplying an HCDS gas to the wafer 200 accommodated within the process chamber 201; a step of removing the HCDS gas (residual gas) from the interior of the process chamber 201; a step of supplying an $NH_3$ gas to the wafer 200 accommodated within the process chamber 201; and a step of removing the $NH_3$ gas (residual gas) from the interior of the process chamber 201. The processing conditions are, for example, as follows.

Temperature of wafer 200: 100 to 700 degrees C. (specifically 200 to 630 degrees C., 600 degrees C. in the present embodiment)
Internal pressure of process chamber: 1 to 4,000 Pa (specifically 10 to 1,332 Pa)
Supply flow rate of HCDS gas: 1 to 2,000 sccm (specifically 1 to 500 sccm)
Supply flow rate of $NH_3$ gas: 100 to 10,000 sccm
Supply flow rate of $N_2$ gas: 100 to 10,000 sccm
Thickness of SiN film: 0.2 to 10 nm In the subject specification, for the sake of convenience, the film forming sequence may be indicated as follows. This indication will be used in the modifications and other embodiments to be described later.

$HCDS \rightarrow NH_3) \times n \Rightarrow SiN$

The term "substrate" used herein is synonymous with the term "wafer".

(Wafer Charging and Boat Loading)

If a plurality of wafers 200 is charged to the boat 217 (wafer charging), the boat 217 is loaded into the process chamber 201 by a boat elevator (boat loading). At this time, the seal cap 219 air-tightly closes (seals) the lower end portion of the reaction tube 203 through an O-ring.

(Pressure Regulation and Temperature Adjustment)

The interior of the process chamber 201, namely the space in which the wafers 200 exist, is evacuated into a predetermined pressure (vacuum level) by the vacuum pump 246. At this time, the internal pressure of the process chamber 201 is measured by the pressure sensor 245. The APC valve 244 is feedback-controlled based on the pressure information thus measured. The vacuum pump 246 is kept activated at least until the processing of the wafers 200 is completed.

The wafers 200 accommodated within the process chamber 201 are heated to a predetermined temperature by the heater 207. At this time, the state of supplying electric power to the heater 207 is feedback-controlled based on the temperature information detected by the temperature sensor 1, so that the process chamber 201 has a predetermined temperature distribution. The heating of the interior of the process chamber 201 by the heater 207 is continuously performed at least until the processing of the wafers 200 is completed.

Furthermore, the rotation of the boat 217 and the wafers 200 by the rotating mechanism 267 is started. As the boat 217 is rotated by the rotating mechanism 267, the wafers 200 are rotated. The rotation of the boat 217 and the wafers 200 by the rotating mechanism 267 is continuously performed at least until the processing of the wafers 200 is completed.

(Film Forming Process)

If the internal temperature of the process chamber 201 is stabilized at a predetermined processing temperature, the following two steps, namely steps 1 and 2, are sequentially performed.

[Step 1]

At this step, an HCDS gas is supplied to the wafers 200 accommodated within the process chamber 201.

The valves 330b and 330e are opened to allow the HCDS gas to flow through the gas supply pipe 310b. The flow rate of the HCDS gas is adjusted by the MFC. The HCDS gas is supplied into the process chamber 201 via the nozzle 340b and is exhausted from the exhaust pipe 232. At this time, the HCDS gas is supplied to the wafer 200. At the same time, the valves 330a and 330c are opened to allow an $N_2$ gas to flow through the gas supply pipes 310a and 310c. The flow rate of the $N_2$ gas is adjusted by the MFC. The $N_2$ gas is supplied into the process chamber 201 together with the HCDS gas and is exhausted from the exhaust pipe 232. By supplying the HCDS gas to the wafer 200, a silicon (Si)-containing layer as a first layer is formed on the outermost surface of the wafer 200.

After the first layer is formed, the valve 330b is closed to stop the supply of the HCDS gas. At this time, while keeping the APC valve 244 opened, the interior of the process chamber 201 is evacuated by the vacuum pump 246. The HCDS gas remaining within the process chamber 201, which has not reacted or which has contributed to the formation of the first layer, is removed from the interior of the process chamber 201. At this time, while keeping the valves 330a and 330c opened, the supply of the $N_2$ gas into the process chamber 201 is maintained. The $N_2$ gas acts as a purge gas. This makes it possible to effectively remove the gas remaining within the process chamber 201 from the interior of the process chamber 201.

In this operation, the gas remaining within the process chamber 201 may not be completely removed and the interior of the process chamber 201 may not be completely purged. If the amount of the gas remaining within the process chamber 201 is small, an adverse effect may not be generated at step 2, which will be subsequently performed. The flow rate of the $N_2$ gas supplied into the process chamber 201 need not be made large. For example, the amount of the $N_2$ gas to be supplied into the process chamber 201 may be substantially equal to the volume of the reaction tube 203 (the process chamber 201) such that a purge operation can be performed without causing an adverse effect at step 2. By not completely purging the interior of the process chamber 201 in this way, it is possible to shorten the purge time and to improve the throughput. It is also possible to suppress the consumption of the $N_2$ gas to a necessary minimum level.

[Step 2]

After step 1 is completed, an $NH_3$ gas is supplied to the wafers 200 accommodated within the process chamber 201, namely the first layer formed on the wafer 200. The $NH_3$ gas is thermally activated and supplied to the wafer 200.

At this step, the opening/closing control of the valves 330a and 330d is executed by a procedure similar to the procedure of the opening/closing control of the valves 330b and 330e executed at step 1. The flow rate of the $NH_3$ gas is adjusted by the MFC. The $NH_3$ gas is supplied into the process chamber 201 via the nozzle 340a and is exhausted from the exhaust port 232. At this time, the $NH_3$ gas is supplied to the wafer 200. The $NH_3$ gas supplied to the wafer 200 reacts with at least a portion of the first layer, namely the Si-containing layer, which is formed on the wafer 200 at step 1. Thus, the first layer is thermally nitrided in an non-plasma manner and is changed (modified) to a second layer containing Si and N, namely a silicon nitride layer (SiN layer). Alternatively, at this time, a plasma-excited $NH_3$ gas may be supplied to the wafer 200 to plasma-nitride the first layer, thereby changing the first layer to a second layer (SiN layer).

After the second layer is formed, the valves 330a and 330d are closed to stop the supply of the $NH_3$ gas. Then, the $NH_3$ gas remaining within the process chamber 201, which has not reacted or which has contributed to the formation of the second layer, and the reaction byproducts remaining within the process chamber 201, are removed from the interior of the process chamber 201 by a procedure similar to that of step 1. At this time, similar to step 1, the gas remaining within the process chamber 201 may not be completely discharged.

(Performing a Predetermined Number of Times)

An SiN film having a predetermined composition and a predetermined film thickness can be formed on the wafer 200 by performing, a predetermined number of times (n times), a cycle which non-simultaneously, i.e., non-synchronously, performs steps 1 and 2 described above. The aforementioned cycle may be repeated multiple times. That is to say, the thickness of the second layer (SiN layer) formed when performing the aforementioned cycle once may be set smaller than a predetermined film thickness. The aforementioned cycle may be repeated multiple times until the thickness of the SiN film formed by laminating the second layer (SiN layer) becomes equal to the predetermined film thickness.

(Purge and Return to Atmospheric Pressure)

After the film forming process is completed, the valves 330e and 330f are opened. An $N_2$ gas is supplied into the process chamber 201 from the gas supply pipes 310b and 310c and is exhausted from the exhaust pipe 232. The $N_2$ gas acts as a purge gas. Thus, the interior of the process chamber 201 is purged, and the gas and the reaction byproducts remaining within the process chamber 201 are removed from the interior of the process chamber 201 (purge). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unloading and Wafer Discharge)

The seal cap 219 is moved down by the boat elevator 115 to open the lower end of the reaction tube 203. The processed wafers 200 supported by the boat 217 are unloaded from the lower end of the reaction tube 203 to the outside of the reaction tube 203 (boat unloading). Thereafter, the processed wafers 200 are discharged from the boat 217 (wafer discharge).

According to the present embodiment (the first embodiment), one or more effects set forth in items (a) to (i) below may be achieved.

(a) According to the present embodiment (the first embodiment), the thermocouple is disposed outside the reaction tube. Thus, there is no possibility that the thermocouple is damaged under the influence of film formation and particles are generated from the thermocouple. For example, if a thermocouple (control-purpose TC) is installed inside a process chamber where film formation is performed, a film is formed on a protective tube. Consequently, the protective tube is damaged and becomes a particle generation source. However, according to the present embodiment, such a situation does not occur. As another example, if the interior of a reaction tube is repeatedly brought into a vacuum state and an atmospheric pressure state, a thermocouple (control-purpose TC) is displaced. Consequently, the thermocouple (control-purpose TC) makes contact with the reaction tube or the boat and becomes a particle generation source. However, according to the present embodiment, such a situation does not occur.

(b) According to the present embodiment (the first embodiment), the temperature measuring point is covered with the protective member. Thus, the thermocouple can be held at a plurality of locations as well as the furnace opening portion. Accordingly, the thermocouple can withstand an earthquake of a certain intensity (e.g., about 300 Gal). This eliminates a possibility that the thermocouple is damaged.

(c) According to the present embodiment (the first embodiment), the fixing jig for fixing the thermocouple to the reaction tube is installed and the temperature measuring point of the thermocouple is covered with the hanging structure. Thus, the direction in which the thermocouple wire is extended by thermal expansion is limited to the ground surface direction. This reduces the probability of breakage of the thermocouple wire.

(d) According to the present embodiment (the first embodiment), the thermocouple is disposed outside the reaction tube. Furthermore, the temperature measuring portion is covered with only the alumina insulation pipe instead of a quartz protective cover which has been used in the related art to cover a control-purpose TC (L-shaped cascade thermocouple). Thus, the responsiveness of the thermocouple (the detection accuracy of the temperature detection part) is improved and the temperature characteristic similar to the temperature characteristic of the substrate (wafer) can be acquired. Accordingly, the temperature control function is improved.

(e) According to the present embodiment (the first embodiment), when the temperature measuring point is covered with the quartz-made protective member, the thermal insulator is installed at least in the lower portion of the protective member. It is therefore possible to suppress erroneous detection of the thermocouple 1 which may otherwise be generated due to the inflow of a coolant. Thus, the reduction of the temperature control function is suppressed.

(f) According to the present embodiment (the first embodiment), the thermocouple is moved from the interior of the reaction tube to the outside thereof. Thus, the temperature measuring point of the thermocouple comes close to the heater wire. It is therefore possible to change the temperature increasing/decreasing characteristic and to shorten the time required in stabilizing the temperature. This enables the temperature of the substrate to reach a target temperature within a short period of time. Thus, the improvement of throughput is achieved.

(g) According to the present embodiment (the first embodiment), the thermocouple is moved from the interior of the reaction tube to the outside thereof. Thus, the temperature measuring point of the thermocouple comes close to the heater wire. It is therefore possible to improve the temperature increasing/decreasing characteristic and to bring the stabilized temperature close to a preset temperature. This enables the temperature distribution of the substrate to come close to a desired temperature distribution. Thus, the improvement of throughput is achieved.

(h) According to the present embodiment (the first embodiment), the gas supply area and the gas exhaust area are formed outside the process chamber. Thus, it is not necessary to install a nozzle, as a gas supply means for supplying a gas, in the process chamber. It is therefore possible to reduce the gap between the edges of the substrates and the inner wall of the reaction tube and to significantly reduce the volume of the reaction tube as compared with a reaction tube of related art. This makes it possible to restrain the process gas from flowing through the gap between the edges of the wafers and the inner wall of the reaction tube. Thus, it is possible to supply a sufficient amount of process gas to between the substrates and to improve the substitution efficiency of the process gas.

(i) According to the present embodiment (the first embodiment), the inner walls are formed in the gas supply area and the gas exhaust area. This makes it possible to make up for the strength reduction of the reaction tube which may be generated when the gas supply area and the gas exhaust area are formed outside the process chamber. It is therefore possible to reduce the breakage risk of the reaction tube while reducing the volume of the reaction tube.

Second Embodiment of the Present Disclosure

Next, a second embodiment will be described with reference to FIGS. 14 and 15. Since the second embodiment is identical in basic configuration with the first embodiment, only the configurations of the thermocouple 1 and the cover 2 differing from those of the first embodiment will be described.

Figure 14:
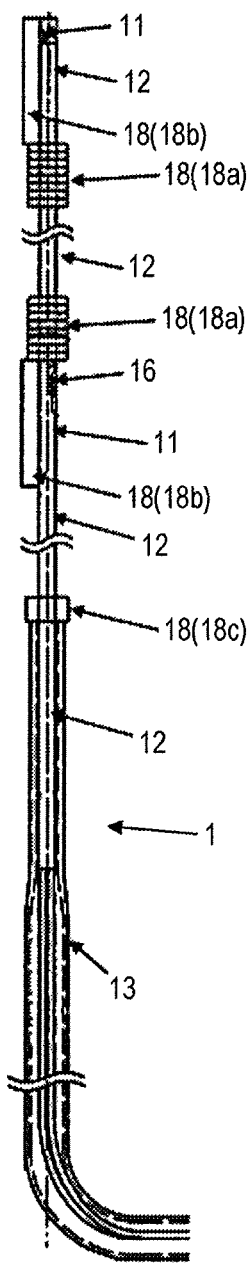
FIG. 14 is a schematic configuration view of a thermocouple attached to a reaction tube of a substrate processing apparatus suitably employed in a second embodiment of the present disclosure.

The thermocouple 1 illustrated in FIG. 14 is configured to include spacers 18 (18a, 18b and 18c) as cushioning portions. Other configurations are identical with the configurations of the thermocouple 1 described in the first embodiment. Thus, detailed descriptions of the thermocouple configurations having nothing to do with the cushioning portions 18 will be omitted.

Specifically, the thermocouple 1 as a temperature detection part employed in the second embodiment is configured to include a temperature measuring portion 11 (16) configured to measure the internal temperature of the reaction tube 203, a main body portion 12 provided therein with a wire 14 which constitutes the temperature measuring portion 11 (16), a protective tube 13 connected to the main body portion 12 at the lower side of the temperature detection part and configured to protect the wire 14, and an acquisition portion 15 connected to the wire 14 and configured to acquire the temperature measured by the temperature measuring portion 11 (16). The cushioning portions 18 are installed at least some portions of the main body portion 12. The thermocouple 1 (the main body portion 12) can be attached to the outside of the reaction tube 203 through the cushioning portions 18 (18a and 18b) while making contact with the reaction tube 203. The cushioning portions 18 are installed in the vicinity of the temperature measuring portions 11 and 16 and in the boundary between the main body portion 12 and the protective tube 13 along the side surface of the reaction tube 203.

As illustrated in FIG. 14, the cushioning portions 18 (18a) are fixed by winding an alumina sleeve as a thermal insulation member around the main body portion 12 in multiple turns. Furthermore, the cushioning portions 18 (18b) are alumina plates. When the cover 2 is fixed to the reaction tube 203, the cushioning portions 18 (18b) are interposed between the main body portion 12 and the reaction tube 203. Moreover, the cushioning portion 18(18c) is an alumina insulation pipe having a hollow cylindrical shape and is installed so as to cover the outer circumference of the main body portion 12.

As described above, the cushioning portions 18 are attached to the vicinity of the temperature measuring portion 11(16) and to the boundary between the main body portion 12 and the protective tube 13. The main body portion 12 makes contact with the reaction tube 203 through the cushioning portions 18. Thus, the temperature measuring portion 11 (16) is fixed to a position close to the reaction tube 203. It is therefore possible to secure temperature control performance. That is to say, by bringing the temperature measuring portion 11 (16) into contact with the reaction tube 203 using the spacer 18, it is possible to reduce the temperature variation between zones and the variation of the temperature increasing characteristic. Consequently, the temperature control performance is improved. In the meantime, an appropriate clearance is maintained between the protective tube 13 and the reaction tube 203 by the spacer 18. Thus, the stress applied to the protective tube 13 is relaxed. This reduces the breakage risk of the protective tube 13.

Furthermore, the cushioning portion 18(18a) is wound so as to have a diameter of about 10 mm. The cushioning portion 18(18a) contributes to the fixing of the thermocouple 1. On the other hand, the cushioning portion 18(18c) has a diameter of 10 mm. Since the diameter of the cushioning portion 18(18c) is set larger than the diameter (4 mm) of the main body portion 12 and the diameter (8 mm) of the adjoining protective tube 13, the cushioning portion 18(18c) contributes to the appropriate adjustment of the clearance between the reaction tube 203 and the protective tube 13. In this regard, similar to the cushioning portion 18(18c), the cushioning portion 18(18a) may be installed so as to surround the main body portion 12. In the present embodiment, the cushioning portion 18(18b) is formed into an elongated plate shape so as to have a width of 8 mm, a length of 30 mm and a thickness of 4 mm and is made of alumina. The cushioning portion 18(18b) is installed in a space formed in a below-described cover 2 with an appropriate clearance left between the cushioning portion 18(18b) and the cover 2. In the present embodiment, the cushioning portions 18 (18b and 18c) are attached (fixedly secured) to the main body portion 12 so as to become one piece with the main body portion 12.

Figure 15:
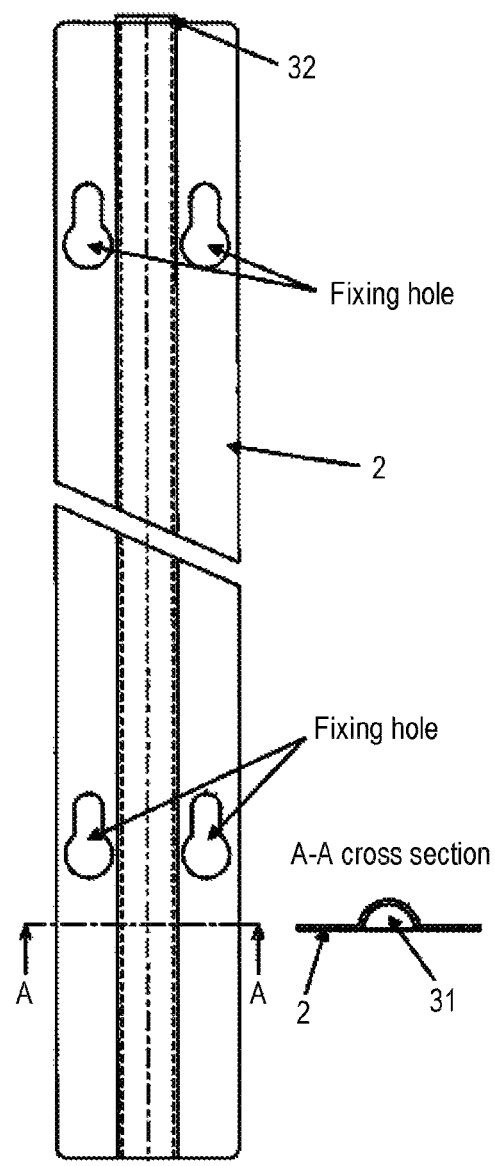
FIG. 15 is a view illustrating one example of a protective member suitably employed in the second embodiment of the present disclosure.

As illustrated in FIG. 15, a cover 2 employed in the second embodiment has an enlarged form of the cover 2 employed in the first embodiment. Unlike the cover 2 employed in the first embodiment, the cover 2 employed in the second embodiment is configured to cover not only the temperature measuring portion 11 of the thermocouple 1 but also the entirety of the reaction tube 203. Hereinafter, the cover 2 employed in the second embodiment may sometimes be referred to as a full cover.

The cover 2 is installed along the reaction tube 203 so as to cover (surround) at least a substrate processing region. The heater 207 as a heating part has a plurality of independent heating zones (a U zone, a CU zone, a CL zone and an L zone). The cover 2 is installed so as to cover at least one heating zone (the CU zone or the CL zone).

The cover 2 includes a distal end portion 32 as a top portion capped with a plate-shaped member. The plate-shaped member is attached to the cover 2 by, for example, welding, so as to become one piece with the cover 2. As illustrated in FIG. 15, the cover 2 is provided with a space portion 31 shown in a cross section. The thermocouple 1 can be disposed in the space portion 31. The cross-sectional area of the spacer 18(18a) installed near the thermocouple 1 is set substantially equal to the cross-sectional area of the space portion 31. The spacer 18(18a) is installed with no clearance. Thus, the thermocouple 1 is fixed so as to make contact with the reaction tube 203. Furthermore, the spacer 18b is fixed in advance, by an adhesive agent such as alumina cement or the like, to the main body portion 12 within which the temperature measuring portion 11(16) of the thermocouple 1 is installed. The spacer 18b and the main body portion 12 are installed in the space portion 31 with a predetermined clearance left therebetween. Thus, there is no possibility that the thermocouple 1 is damaged due to the pressing of the cover 2. In addition, the thermocouple 1 (specifically, the main body portion 12 within which the temperature measuring portion 11(16) is installed) makes contact with the reaction tube 203 through the spacer 18b.

The full cover 2 is fixed to the reaction tube 203 in the same manner as described in the first embodiment. Pins 23 prepared in advance are disposed on the outer surface of the reaction tube 203. Holes (fixing holes) are prepared in advance in the cover 2 so that the holes engage with the pins 23. In the present embodiment, the pins 23 are made of quartz. Specifically, the pins 23 and the holes formed in the cover 2 are respectively four in number. The cover 2 is fixed at four points by bringing the fixing holes into engagement with the pins 23.

The positions of the four pins 23 and the four fixing holes formed in the cover 2 do not depend on the number of the temperature measuring portions 11 disposed in the space portion 31. The cover 2 as a whole is fixed at predetermined four points. The distal end portion 32 of the full cover 2 is designed to become flush with the top portion of the reaction tube 203. In the meantime, the distance from the upper end portion to the lower end portion of the full cover 2 is designed to cover at least the substrate processing region.

By changing the design of the cover 2 of the first embodiment to the design of the full cover 2 of the second embodiment in this way, even when supplying the coolant which cools the heater 207 disposed so as to face the cover 2, the coolant is not directly injected toward the main body portion 12 of the thermocouple 1. It is therefore possible to suppress the influence on the temperature characteristic.

Similar to the thermocouple 1 according to the first embodiment, the protective tube 13 (made of, for example, quartz) is installed below the main body portion 12 (the thermocouple 1). Since the configuration of the protective tube 13 remains unchanged, descriptions will be made on the differing portions. FIGS. 22A to 23C illustrate detail views of the protective tube 13 of the second embodiment installed below the insulation pipe 12.

Figure 23A:
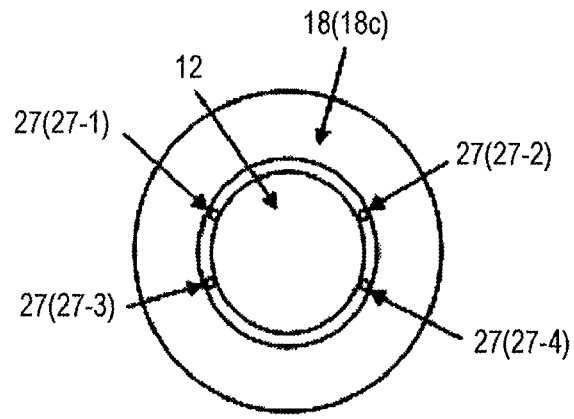
FIG. 23A shows a cross section taken along line A-A in FIG. 22B.
Figure 23B:
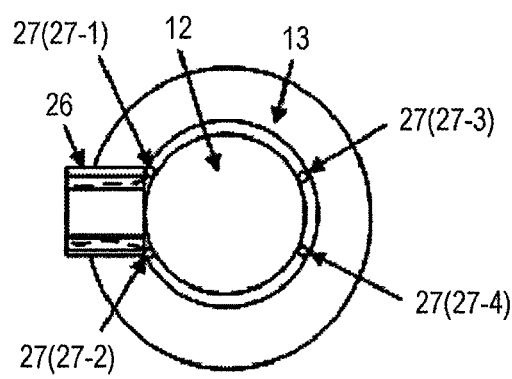
FIG. 23B shows a cross section taken along line B-B in FIG. 22B
Figure 23C:
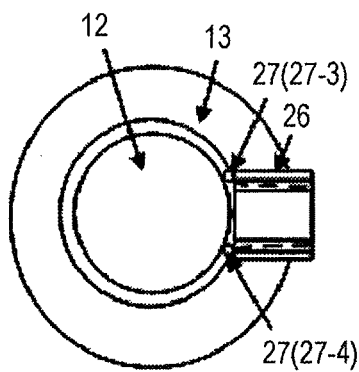
FIG. 23C shows a cross section taken along line C-C in FIG. 22B.

A plurality of opening portions for allowing platinum (Pt) lines 27 to pass therethrough is formed in the protective tube 13. The platinum (Pt) lines 27 are caused to pass through the clearance generated when installing the cushioning portion 18c in the main body portion 12. For example, as illustrated in FIGS. 23A to 23C, four platinum (Pt) lines 27-1, 27-2, 27-3 and 27-4 are caused to pass through the clearance between the main body portion 12 and the cushioning portion 18c and are drawn out from an opening path for passage of the platinum (Pt) lines 27, which is installed within a fixing portion 26 mounted to the opening portions. By interconnecting the platinum (Pt) lines 27, the main body portion 12 and the protective tube 13 are fixed to each other. The fixing portion 26 is made of alumina and fixed to the main body portion 12 by an adhesive agent or the like. Since both of the main body portion 12 and the fixing portion 26 are made of alumina, the alumina cement 17 is used as the adhesive agent. However, the alumina-made main body portion 12 (including the fixing portion 26) and the quartz-made protective tube 13 are connected by binding them with the platinum lines 27, instead of by bonding quartz and alumina insulation pipe. This configuration does not restrict thermal expansion of alumina.

The platinum (Pt) lines 27, which has a diameter Φ of 0.3 mm, can pass through the clearance illustrated in FIGS. 23A to 23C before the adhesive agent is dried. The space between the cushioning portion 18c and the main body portion 12 is compacted (filled) by the adhesive agent with no gap. In the meantime, as illustrated in FIG. 23A to 23C, the platinum lines 27 can pass through the clearance between the protective tube 13 and the main body portion 12. Furthermore, by fixing the fixing portion 26 to the main body portion 12 as illustrated in FIG. 23A to 23C, it is possible to fix the protective tube 13 to the main body portion 12.

There may be a case where the protective tube 13 is broken by the stress attributable to the thermal expansion difference between the protective tube 13 (having a small thermal expansion coefficient) and the insulation pipe 12 and the alumina cement 17 (having a large thermal expansion coefficient). Thus, instead of filling the adhesive agent such as the alumina cement 17 or the like from the opening portions, the main body portion 12 and the protective tube 13 are fixed by the platinum lines 27. This makes it possible to prevent breakage of the protective tube 13 attributable to the thermal expansion difference between the materials.

According to the present embodiment, at least one of the effects of the first embodiment described above and effects set forth in items (j) to (n) below may be achieved.

(j) According to the present embodiment, the thermocouple includes at least the main body portion within which the temperature measuring portion for measuring the internal temperature of the reaction tube is installed. The cushioning portion is installed in at least a portion of the main body portion. The temperature measuring portion is fixed to the outside of the reaction tube in a state in which the temperature measuring portion makes contact with the reaction tube through the cushioning portion. Thus, the thermocouple can withstand an earthquake of certain intensity and can withstand a vibration. Accordingly, there is no possibility that the thermocouple is damaged.

(k) According to the present embodiment, the thermocouple is configured to detect a temperature in a state in which the main body portion having the temperature measuring portion mounted therein makes contact with the reaction tube through the heat insulation member. Thus, the temperature responsiveness is improved. In addition, it is possible to repeat the temperature measurement. Thus, the temperature reproducibility is improved.

(l) According to the present embodiment, only four pins and four fixing holes are used to fix the thermocouple having a plurality of temperature measuring portions. Therefore, as compared with the first embodiment, it is possible to simplify the processing work of the quartz-made members (the reaction tube and the cover) and to reliably fix the thermocouple at a low cost.

(m) According to the present embodiment, the thermocouple is fixed to the side surface of the reaction tube by the cover so that the coolant is not directly injected to the thermocouple (the main body portion or the temperature measuring portion). It is therefore possible to suppress erroneous detection of the internal temperature of the reaction tube and to maintain the temperature control performance.

(n) According to the present embodiment, it is possible to prevent the protective tube (particularly, the quartz of the L-shaped portion) from being broken by the stress attributable to the thermal expansion difference between the protective tube (having a small thermal expansion coefficient) and the insulation pipe and the adhesive agent (having a large thermal expansion coefficient).

Third Embodiment of the Present Disclosure

Figure 16:
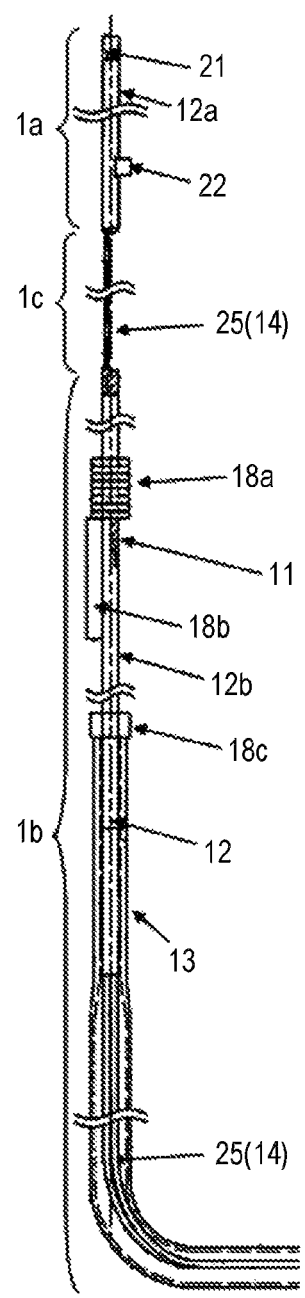
FIG. 16 is a schematic configuration view of a thermocouple attached to a reaction tube of a substrate processing apparatus suitably employed in a third embodiment of the present disclosure.

FIG. 16 illustrates a thermocouple 1 for controlling a temperature of a ceiling of a reaction tube. As illustrated in FIG. 16, the thermocouple 1 according to the third embodiment includes at least a ceiling thermocouple 1a (hereinafter also referred to as a thermocouple 1a) configured to control a temperature of a ceiling of a reaction tube and provided with a temperature measuring portion 21 as a temperature measuring point, a sidewall thermocouple 1b (hereinafter also referred to as a thermocouple 1b) configured to control a temperature of a sidewall of the reaction tube, and connection portion 1c configured to interconnect the thermocouple 1a and the thermocouple 1b.

That is to say, the thermocouple 1 as a temperature detection part employed in the third embodiment includes a thermocouple 1a as a first main body portion provided with a first temperature measuring portion 21 for measuring a temperature of a ceiling of a reaction tube and installed on the ceiling of the reaction tube, a thermocouple 1b as a second main body portion installed on a side surface of the reaction tube, and a connection portion 1c configured to interconnect the first main body portion and the second main body portion. The first temperature measuring portion 21 is fixed to a central position of the ceiling of the reaction tube.

Furthermore, a substrate processing apparatus provided with the thermocouple 1 employed in the third embodiment is configured to include a ceiling heater 34 as a heating part configured to heat the interior of the reaction tube 203, and a cover 2 as a ceiling cover installed between the heating part 34 and the first main body portion facing the heating part 34 and fixed to the ceiling of the reaction tube, the cover 2 having a space through which the first main body portion extends. Furthermore, a pin 22 (hereinafter also referred to as a positioning pin) as a projection portion attached to the first main body portion is inserted into an opening portion formed in the ceiling cover 2. Thus, the first temperature measuring portion is fixed to the central position of the ceiling cover 2.

As illustrated in FIG. 16, in the thermocouple 1 according to the third embodiment, the thermocouple 1b for controlling the temperature of the sidewall of the reaction tube extends upward and is bent along the outer surface of the reaction tube so that the temperature measuring point 21 is disposed on the ceiling of the reaction tube. Except the configuration installed on the ceiling, the configurations of the thermocouple 1 of the third embodiment are substantially identical with those of the first embodiment and the second embodiment. Hereinafter, detailed descriptions of the identical configurations will be omitted and only the differing configurations will be described. For example, the thermocouple 1b has the same configuration as that of the second embodiment except the position in which the temperature measuring portion 11 is installed. Thus, detailed descriptions of the thermocouple 1b will be omitted. Unlike the second embodiment, the temperature measuring portion 11 of the thermocouple 1b may not be installed.

As illustrated in FIG. 16, similar to the first embodiment and the second embodiment, the temperature measuring portion 21 is installed at the distal end of the thermocouple 1. Accordingly, the thermocouple 1a includes at least a main body portion 12a. The thermocouple wire 14 extends through an opening portion formed within the main body portion 12a.

Furthermore, the pin 22 is disposed in the thermocouple 1a. A fixing hole as an opening portion for fixing the pin 22 is formed in the ceiling cover 2 which covers the ceiling of the reaction tube 203. The thermocouple 1 is positioned in place by the pin 22 and the fixing hole. At this time, the temperature measuring portion 21 is disposed at the center of the reaction tube 203 and is disposed in the central portion of the ceiling cover 2.

The main body portion 12 is not installed in the connection portion 1c in order to absorb expansion of the wire 14 of the thermocouple 1a. Furthermore, the connection portion 1c is formed by winding an alumina sleeve 25 as an insulation member (insulation sleeve) around the thermocouple wire 14. Alternatively, the connection portion 1c may be surrounded by a quartz tube or the like.

Figure 17A:
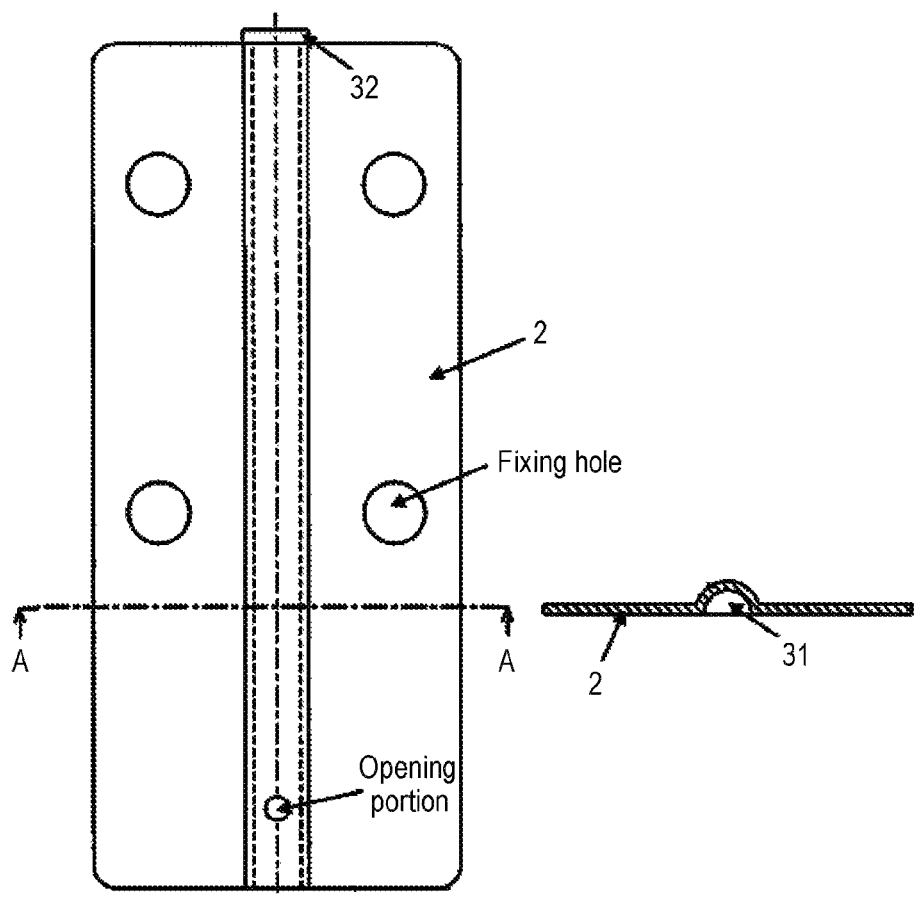
FIG. 17A is a view illustrating one example of a protective member for the protection of a ceiling suitably employed in the third embodiment of the present disclosure.

FIG. 17A illustrates a cover 2 as a ceiling cover which covers the thermocouple 1 for controlling the temperature of the ceiling of the reaction tube. A fixing hole, into which the pin 22 is inserted, is formed in the ceiling cover 2. Similar to the full cover described above, the ceiling cover 2 includes a space portion 31 for accommodating the thermocouple 1 and a lid disposed on the distal end portion 32. Similar to the covers 2 of the first embodiment and the second embodiment, four fixing holes for fixing the ceiling cover 2 are formed in the ceiling cover 2.

Figure 17B:
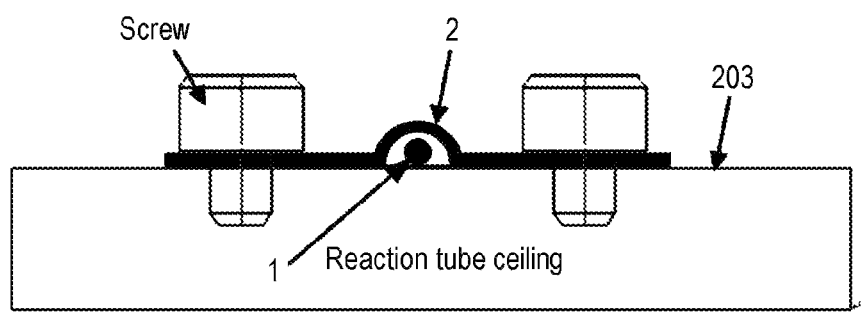
FIG. 17B is a schematic cross-sectional view illustrating a state available after attaching the protective member for the protection of a ceiling suitably employed in the third embodiment of the present disclosure.

As illustrated in FIG. 17B, the thermocouple 1 (the main body portion 12) is configured to make direct contact with the ceiling of the reaction tube 203. Furthermore, fixing holes are also formed on the ceiling of the reaction tube 203 in alignment with the fixing holes of the ceiling cover 2. It can be noted that the ceiling cover 2 is fixed to the ceiling of the reaction tube 203 by screws. Due to the structure of the reaction tube 203, the ceiling of the reaction tube 203 is configured to have a large thickness. Therefore, the fixing holes formed on the reaction tube 203 do not affect the temperature characteristic.

Figure 18:
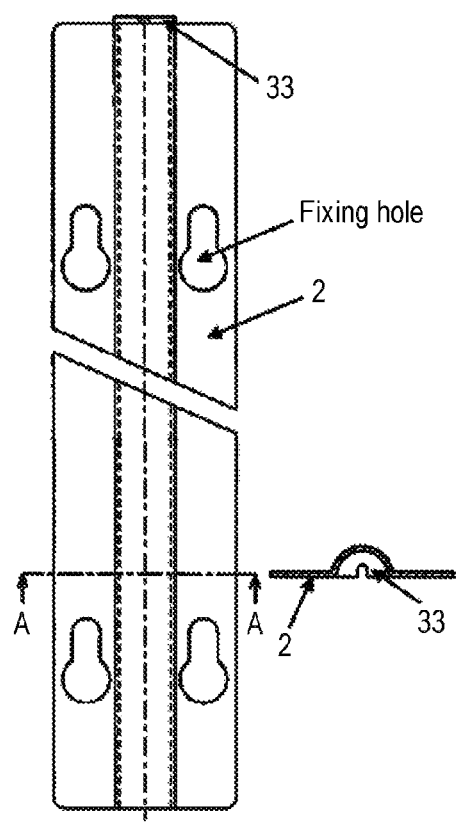
FIG. 18 is a view illustrating one example of a protective member for the protection of a sidewall suitably employed in the third embodiment of the present disclosure.

As illustrated in FIG. 18, the full cover 2 according to the third embodiment is identical in size and in configuration, such as the formation of the space portion 31 or the like, with the full cover 2 of the second embodiment. Descriptions will be made herein on the points differing from the full cover 2 of the second embodiment.

In the space portion 31, there is installed a clamping portion 33 which constitutes a through-hole through which the main body portion 12 of the thermocouple 1 extends. The clamping portion 33 is formed over the total length of the full cover 2. The through-hole has a diameter substantially equal to the diameter of the main body portion 12. By fixing the full cover 2 to the reaction tube 203, the thermocouple 1 is positioned in place.

Figure 21A:
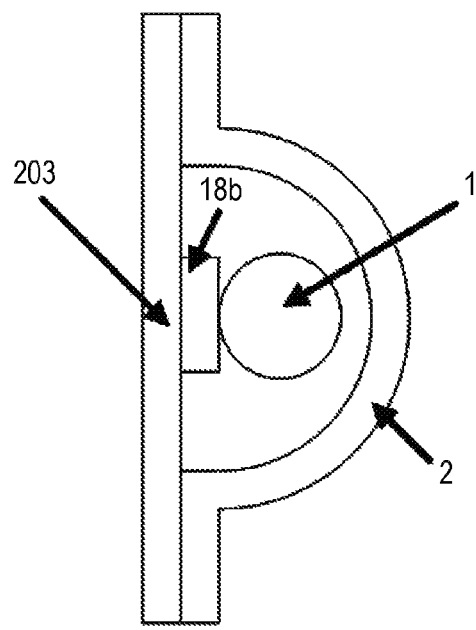
FIGS. 21A and 21B are sectional views illustrating the states in which the thermocouples suitably employed in the second embodiment and the third embodiment are attached to the reaction tube.
Figure 21B:
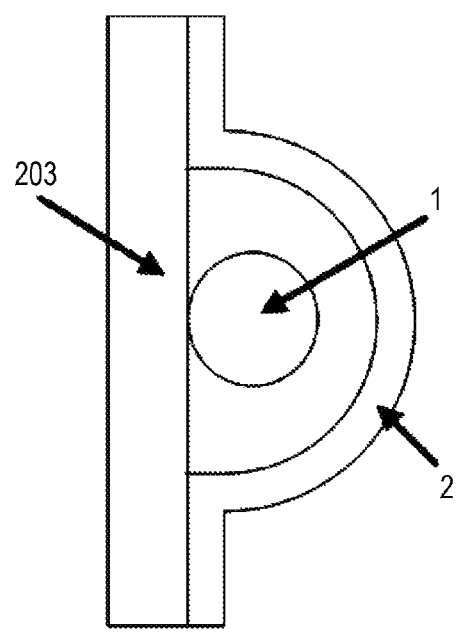
Figure 22A:
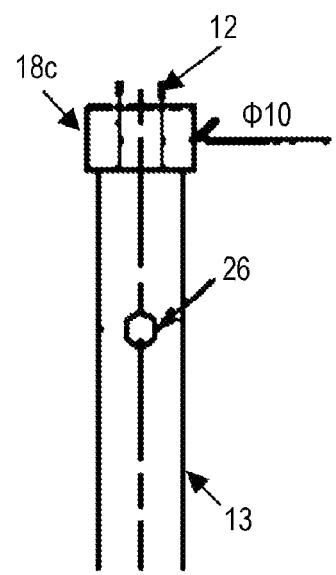
FIGS. 22A and 22B are schematic configuration views of the thermocouples suitably employed in the second embodiment and the third embodiment, in which the attachment states of a main body portion and a protective portion are shown in a schematic diagram.
Figure 22B:
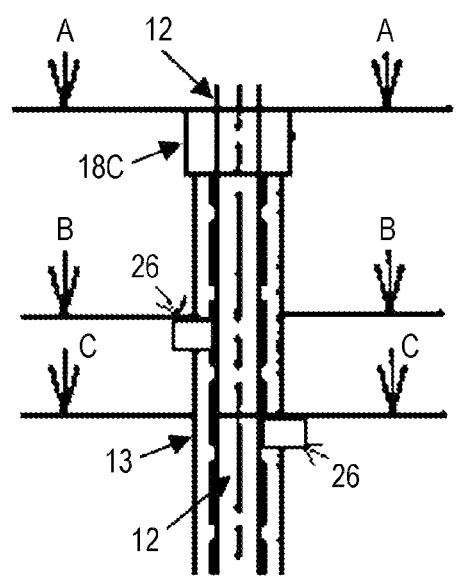

According to the present embodiment, the thickness of the cushioning portion 18b may be set so as to equalize the state in which the thermocouple 1 makes contact with the ceiling of the reaction tube 203 and the state in which the thermocouple 1 makes contact with the sidewall of the reaction tube 203 through the cushioning portion 18b. For example, as illustrated in FIGS. 21A and 21B, the thickness of the ceiling of the reaction tube 203 is set equal to the total thickness of the sidewall of the reaction tube 203 and the cushioning portion 18b. Thus, the thermocouple 1 installed on the ceiling of the reaction tube 203 and the thermocouple 1 installed on the sidewall of the reaction tube 203 can detect a temperature at the same level. The thickness may be appropriately changed depending on the material of the cushioning portion 18b.

According to the present embodiment, at least one of the effects of the first embodiment and the second embodiment described above and effects set forth in items (o) to (q) below may be achieved.

(o) According to the present embodiment, the pin 22 is installed in the thermocouple 1a. The fixing hole for allowing the pin 22 to pass therethrough is formed in the ceiling cover 2 and the fixing holes for fixing screws are formed on the ceiling of the reaction tube 203. The pin 22 of the thermocouple 1a is fitted to the fixing hole of the ceiling cover 2, whereby the ceiling cover 2 is positioned in place. The ceiling cover 2 is fixed to the reaction tube 203 by screws. Thus, the thermocouple 1a is fixed to the reaction tube 203. With this configuration, the thermocouple 1 can withstand an earthquake of certain intensity. Thus, there is no possibility that the thermocouple 1 is broken.

(p) According to the present embodiment, the pin 22 of the thermocouple 1a is fitted to the fixing hole of the ceiling cover 2, whereby the ceiling cover 2 is positioned in place. Consequently, the thermocouple 1a is fixed in the central position of the reaction tube 203 in a state in which the temperature measuring point 21 of the thermocouple 1a makes contact with the reaction tube 203. With this configuration, it is possible to accurately detect the temperature of the center of the wafer 200 accommodated within the reaction tube 203.

(q) According to the present embodiment, the pin 22 of the thermocouple 1a is fitted to the fixing hole of the ceiling cover 2, whereby the ceiling cover 2 is positioned in place. Consequently, the temperature measuring point 21 of the thermocouple 1a is disposed at the center of the ceiling cover 2. Thus, the coolant is not directly injected to the thermocouple 1a. It is therefore possible to suppress erroneous detection of the internal temperature of the reaction tube 203.

Fourth Embodiment of the Present Disclosure

Figure 19A:
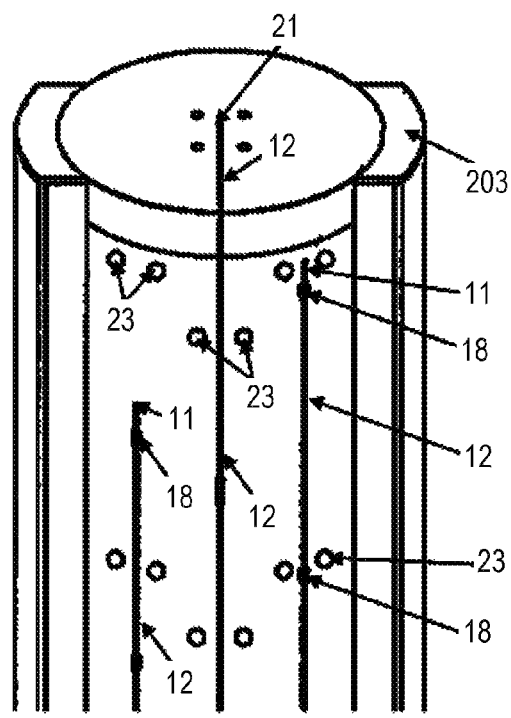
FIG. 19A is a schematic configuration view of a substrate processing apparatus suitably employed in a fourth embodiment of the present disclosure, illustrating a state available after thermocouples are attached to the outside of a reaction tube.
Figure 19B:
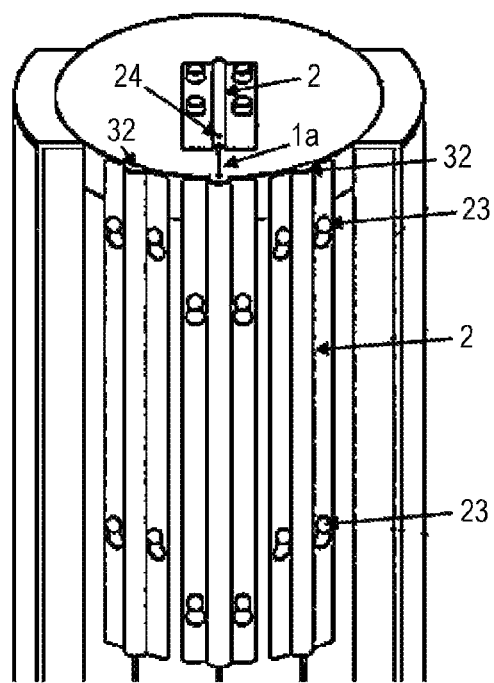
FIG. 19B is a schematic configuration view of the substrate processing apparatus suitably employed in the fourth embodiment of the present disclosure, illustrating a state available after the thermocouples are attached to the outside of the reaction tube and are covered with protective members.

FIGS. 19A and 19B illustrate use examples of the thermocouples employed in the third embodiment and the second embodiment (or the first embodiment).

FIGS. 19A and 19B show a state in which three thermocouples 1 employed in the second embodiment and the third embodiment are installed on the reaction tube 203. The thermocouples 1 disposed at the opposite ends are the thermocouples 1 employed in the second embodiment. The thermocouple 1 disposed at the center is the thermocouple 1 employed in the third embodiment. The thermocouple 1 disposed at the center extends upward so that the temperature measuring portion 21 is installed on the ceiling of the reaction tube 203. The configurations of the protective tube 13 and the like not shown in FIGS. 19A and 19B are the same as those of the first embodiment to the third embodiment.

The substrate processing apparatus according to the fourth embodiment is configured to include: a reaction tube 203 configured to accommodate a boat 217 for holding a plurality of substrates; a first heating part configured to heat the substrates disposed in positions facing a plurality of independent heating zones (a U zone, a UL zone, a CL zone and an L zone); a second heating part configured to heat the substrates disposed in a position facing the U zone; a first thermocouple installed on a sidewall of the reaction tube 203 and configured to detect a temperature of a position facing the first heating part; a second thermocouple including a first main body portion 1a installed on the ceiling of the reaction tube 203, a second main body portion 1b installed on a side surface of the reaction tube 203 and a connection portion 1c configured to interconnect the first main body portion 1a and the second main body portion 1b; a full cover 2 configured to fix the first thermocouple and the second main body portion to the sidewall of the reaction tube 203; a ceiling cover 2 configured to fix the first main body portion to the ceiling of the reaction tube 203; and a control part configured to control at least the first heating part and the second heating part, based on the temperatures detected by the first thermocouple and the second thermocouple, so that an internal temperature of the reaction tube 203 is maintained at a predetermined temperature.

Furthermore, the first main body portion 1a includes a first temperature measuring portion 21 configured to measure the internal temperature of the reaction tube 203. A projection portion installed in the first main body portion 1a is fitted into an opening portion formed in the ceiling cover 2. Thus, the first temperature measuring portion is fixed to a central position of the ceiling of the reaction tube 203 so as to measure the temperature of the center of the substrate heated by the second heating part. For example, as illustrated in FIG. 19A, the first temperature measuring portion is fixed such that the temperature measuring point 21 is disposed at the center of the ceiling of the reaction tube 203 and at the center of four holes for fixing the cover 2. This makes it possible to detect at least a temperature of a central portion of the uppermost wafer 200 accommodated within the reaction tube 203.

As illustrated in FIG. 19A, two thermocouples 1 employed in the second embodiment are installed so that the height positions of the temperature measuring portions 11 and 16 thereof differ from each other. For example, the two thermocouples 1 are respectively disposed in such positions as to detect the temperatures of the U zone, the UL zone, the CL zone and the L zone. The respective thermocouples 1 are fixed in a state in which the thermocouples 1 make contact with the reaction tube 203 through the spacers 18. Thus, the thermocouples 1 are fixed in a state in which the temperature measuring portions 11 and 16 are disposed in close proximity to the reaction tube 203. Accordingly, it is possible to accurately detect the internal temperature of the reaction tube 203. The temperature measuring portions 11 and 16 are covered with the full cover 2 which will be described later.

As illustrated in FIG. 19B, the full cover 2 employed in the second embodiment and the full cover 2 employed in the third embodiment differ from each other in the positions of the fixing holes (the corresponding positions of the pins 23 installed on the reaction tube 203). This is because, if a single-surface arrangement is used, the distance between the pins 23 becomes narrow and the work efficiency grows worse. By making the positions of the fixing holes differ from each other, there is provided an effect of preventing a mistake in mounting the full cover 2 employed in the second embodiment and the full cover 2 employed in the third embodiment.

Furthermore, the full covers 2 are installed so as to cover at least the entirety of a substrate processing region (a region where product wafers 200 are loaded by the boat 217). Moreover, the full covers 2 are installed along the reaction tube 203 so as to cover at least the substrate processing region and are installed so as to cover the reaction tube 203 in a facing relationship with at least a plurality of independent heating zones (a U zone, a CU zone, a CL zone and an L zone).

In the case of the cover 2 employed in the first embodiment, the cover 2 needs to be provided on a zone-by-zone basis. Thus, the attachment work of the cover 2 is time-consuming. According to the present embodiment, the number of pins 23 for attaching the full cover 2 is fixed to four. Thus, only one full cover 2 is installed with respect to one thermocouple. This contributes to the improvement of workability.

FIG. 20 illustrates a thermal processing furnace which makes use of a plurality of thermocouples 1 according to the present embodiment. In the present embodiment, a ceiling heater 34 is installed above the reaction tube 203 so as to heat the central portion of the wafer 200 held in the boat 217. The thermocouples 1 are disposed outside the ceiling of the reaction tube 203. Only one thermocouple is seen in FIG. 20 because two other thermocouples 1 overlap with one thermocouple.

A temperature control system according to the present embodiment includes a first temperature measuring portion installed on the ceiling of the reaction tube 203 and configured to measure the internal temperature of the reaction tube 203, and second temperature measuring portions installed in the positions which face heating zones (a U zone, a CU zone, a CL zone and an L zone) and configured to measure the internal temperature of the reaction tube 203. At least a first heating part and a second heating part are controlled, based on the temperatures detected by the first temperature measuring portion and the second temperature measuring portions, so that the internal temperature of the reaction tube 203 is maintained at a predetermined temperature.

When controlling the temperature of the U zone among the heating zones, the temperature of the centers of the substrates disposed in the U zone (or the substrate held at the uppermost side of the boat 217) is detected by the first temperature measuring portion. The temperature of the edge portions of the substrates disposed in the U zone is detected by the second temperature measuring portion. The first heating part and the second heating part are controlled so that at least a difference between the temperatures detected by the first temperature measuring portion and the second temperature measuring portion falls within a predetermined range, thereby assuring that at least the temperature of the substrates disposed in the U zone is maintained at a predetermined temperature. In this way, the temperature control system is configured to control the temperature of the substrate held at the uppermost side of the boat 217. Thus, it is possible to improve the in-plane uniformity and the inter-pane uniformity of the substrate temperature. The ceiling of the reaction tube is made of thick quartz and has a high heat capacity. This makes it difficult to heat and temperature-control the ceiling of the reaction tube. By installing the first temperature measuring portion on the ceiling of the reaction tube and monitoring the temperature, it is possible to improve the temperature-controllability of the U zone.

The configuration of the thermal processing furnace according to the present embodiment differs from the configuration of the thermal processing furnace illustrated in FIG. 9 in that the ceiling heater 34 is installed above the reaction tube 203 and the thermocouple 1a is installed on the ceiling of the reaction tube 203. Other configurations of the thermal processing furnace according to the present embodiment are substantially the same as the configurations illustrated in FIG. 9. Therefore, detailed descriptions thereof will be omitted. The region, in which the ceiling heater 34 is installed, is a sub-U zone which assists the heating of the U zone. Specifically, the ceiling heater 34 is configured to heat the wafer 200 held at the upper side of the boat 217. In this regard, the temperature measuring portion 21 of the thermocouple 1a functions as a temperature detection part configured to detect the temperature of the sub-U zone. The temperature measuring portion 21 of the thermocouple 1a directly monitors the temperature of the ceiling portion of the reaction tube. Thus, in the present embodiment, the wafer 200 held at the uppermost side of the boat 217 is arranged in a position facing the U zone. However, the present disclosure is not limited to this configuration. The wafer 200 held at the uppermost side of the boat 217 may face the CU zone.

The height of the thermocouple 1 (the temperature measuring portion 11) and the heater thermocouple 24 for detecting the temperature of the U zone is set substantially equal to the height of the wafer 200 held at the uppermost side of the boat 217 accommodated within the reaction tube 203. The heights need not be strictly equal to each other. A deviation of about several centimeters in the heights does not matter. Further, the height of the thermocouple 1 (the temperature measuring portion 11) and the heater thermocouple 24 for detecting the temperature of the U zone are set to be substantially equal to the height of the ceiling of the reaction tube. The ceiling of the reaction tube is made of quartz thicker than other portions. Thus, improvement in temperature control of the ceiling of the reaction tube contributes to improvement of temperature-controllability of wafers. The height may set to a predetermined height between the height of the wafer 200 held at the uppermost side of the boat 217 and the height of the ceiling of the reaction tube.

When heating the top wafer 200 accommodated within the reaction tube 203, the peripheral portion of the top wafer 200 is first heated up and then the central portion of the top wafer 200 is heated up. This makes it difficult to improve the temperature control performance. Thus, in the present embodiment, as illustrated in FIG. 20, the ceiling heater 34 is installed, and the temperature measuring point 21 of the ceiling thermocouple 1a formed by extending the sidewall thermocouple 1 upward and bending the sidewall thermocouple 1 along the outer surface of the reaction tube 203 is disposed in the vicinity of the central portion of the ceiling of the reaction tube 203.

Similar to the sidewall thermocouple 1, the ceiling cover 2 is disposed on the ceiling of the reaction tube 203 and is fixed to the ceiling of the reaction tube 203 by the positioning pin 22. Thus, the behaviors of the temperatures detected by the temperature measuring portion 11 for detecting the temperature of the peripheral portion of the wafer 200 and the temperature measuring portion 21 for detecting the temperature of the central portion of the wafer 200 are similar to each other. It is therefore possible to shorten the temperature recovery time required until a difference between the temperatures of the peripheral portion and the central portion of the wafer 200 reaches a target temperature.

As described above, the wafer 200 held at the uppermost side of the boat 217 is heated from the periphery of the wafer 200 by the heater 207 and is heated from the surface of the wafer 200 by the ceiling heater 34. It is therefore possible to improve the uniformity of the surface temperature of the wafer 200.

In particular, as illustrated in FIG. 20, the in-plane uniformity is improved by using, as a temperature control target, the wafer 200 held at the uppermost side of the boat 217. This makes it possible to improve the in-pane uniformity of the surface temperatures of the wafers 200 held in the substrate processing region.

While not shown in the drawings, a heater may be installed under the boat 217 so that the central portion of the wafer 200 is heated at the lower end side of the reaction tube 203. However, in this case, a temperature detection part needs to be installed even under the boat 217. Furthermore, the inter-plane uniformity of the temperatures of the wafers 200 as well as the in-plane uniformity of the surface temperature of the wafer 200 can be improved by installing a heater (not shown) under the boat 217 and by using, as a temperature control target, the wafer 200 held at the lowermost side of the boat 217.

According to the present embodiment, at least one of the effects of the first embodiment to the third embodiment described above and effects set forth in items (r) and (s) below may be achieved.

(r) According to the present embodiment, the thermocouple installed on the sidewall of the reaction tube and the thermocouple installed on the ceiling of the reaction tube, which is configured to have the same temperature detection sensitivity as the thermocouple installed on the sidewall of the reaction tube, are respectively fixed to the reaction tube in a state in which they make contact with the reaction tube. As described above, by disposing the thermocouples in the positions where the thermocouples can detect the temperatures of the peripheral portion and the central portion of the wafer, it is possible to improve the in-plane uniformity of the temperature of the wafer and to shorten the recovery time required for the temperature to converge to a predetermined temperature.

(s) According to the present embodiment, the heating of the U zone is performed by the heater and the ceiling heater. By heating the peripheral portion and the central portion of the top wafer of the boat in this way, it is possible to improve the in-plane uniformity of the temperature of the wafer. In addition, by disposing the thermocouples in the positions corresponding to the peripheral portion and the central portion of the wafer, it is possible to shorten the recovery time of the wafer in-plane temperature and to improve the productivity.

Other Embodiments of the Present Disclosure

Figure 12A:
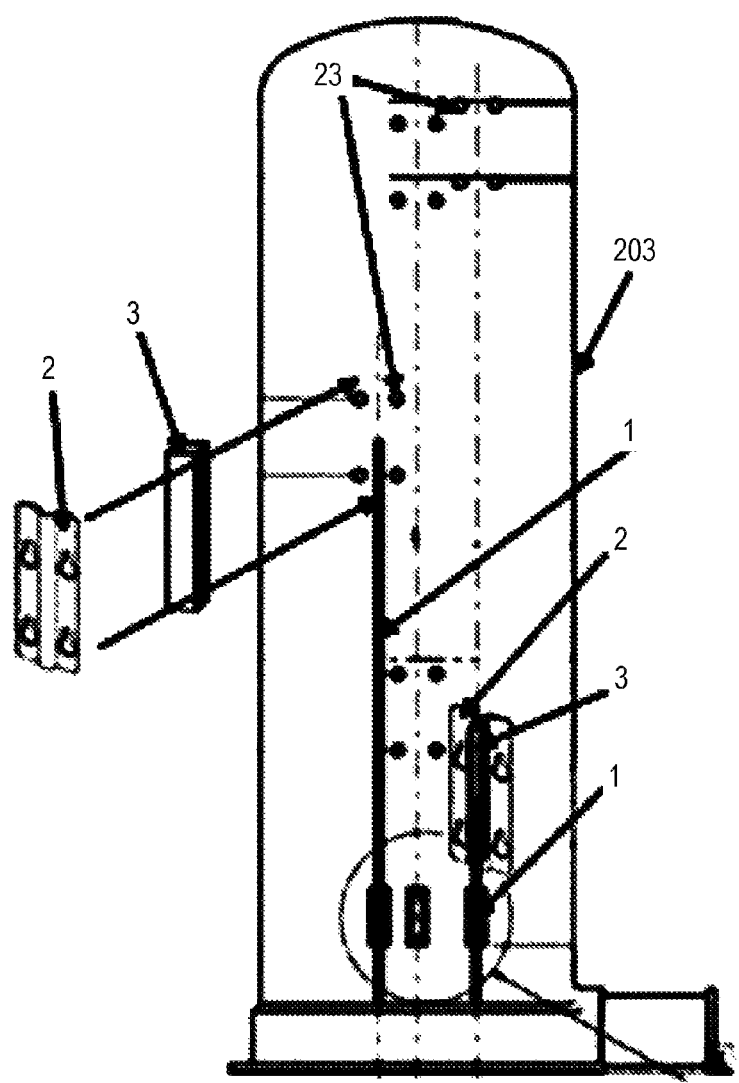
FIG. 12A is a schematic view illustrating a state in which a thermocouple is being attached to the outside of a reaction tube suitably employed in another embodiment of the present disclosure.
Figure 12B:
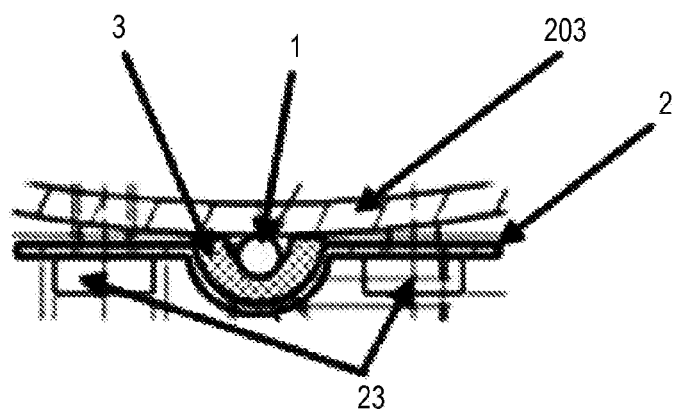
FIG. 12B is a horizontal cross-sectional view illustrating the internal shape of a protective member after the thermocouple is attached to the outside of the reaction tube suitably employed in another embodiment of the present disclosure.

As illustrated in FIGS. 12A and 12B, even if the reaction tube 203 is of a large type, the thermocouple 1 can be similarly fixed to the outside of the reaction tube 203 by preparing the cover 2 as a first fixing jig and the pins 23. In this case (in the case where the number of the wafers to be processed is 100 or more), the temperature increasing speed of the wafers 200 is slow. Thus, it is necessary to adjust the thermal insulation effect by changing the thickness or the material of the thermal insulator 3 and to adjust the temperature increasing speed of the thermocouple (the control-purpose TC) 1. As the temperature increasing characteristic of the heater 207 becomes low or the number of heated objects of the process chamber 201 having a dual-tube structure or the like increases, it is necessary to reduce the temperature increasing speed of the thermocouple (the control-purpose TC) 1 by increasing the thickness of the thermal insulator 3 or using a material having a high thermal insulation effect.

As in the related art, if the thermocouple (the control-purpose TC) 1 is disposed between an inner tube and an outer tube of a dual-reaction-tube structure, a film is also formed on a quartz pipe for protecting the thermocouple. Thus, there is a risk that the quartz pipe is broken due to the film thickness. Furthermore, there is a possibility that particles are generated due to friction or the like. If a thermal insulator is installed between the inner tube and the thermocouple, similar to the thermocouple (the control-purpose TC) 1 employed in the present embodiment, it is possible to bring the behavior of the thermocouple into conformity with the wafer temperature behavior. However, in order to install the thermal insulator 3 in the process chamber 201, it is necessary to select the thermal insulator 3 which conforms to the wafer temperature behavior without affecting a process. This may be a cause of cost increase.

According to the present embodiment (other embodiments), the effects of the first embodiment to the fourth embodiment described above and one or more effects set forth in items (1) to (3) below may be achieved.
(1) According to the present embodiment (other embodiments), even if the reaction tube 203 is of a large type (even if the number of the wafers to be processed is 100 or more), the thermocouple (the control-purpose TC) 1 according to the first embodiment can be installed outside the outer tube (corresponding to the reaction tube 203).
(2) According to the present embodiment (other embodiments), the first temperature measuring portion (or the second temperature measuring portion) is covered with the protective member through the thermal insulator. Thus, the thermal insulation effect can be adjusted by the thermal insulator. With this configuration, it is possible to bring the characteristic of the temperature detected by the thermocouple into conformity with the temperature increasing speed of the wafer while suppressing the influence of the heater.
(3) According to the present embodiment (other embodiments), even when there is a need to adjust the thickness of the thermal insulator, it is only required to perform simple processing by which the protective member is processed and it is only necessary to attach the processed protective member to the reaction tube 203. Thus, the thermal insulation effect can be adjusted without incurring much cost.

In the aforementioned embodiments, the vertical semiconductor manufacturing apparatus, which is one kind of a substrate processing apparatus, has been described in detail. However, the present disclosure is not limited thereto. The present disclosure may be applied to, for example, a horizontal semiconductor manufacturing apparatus.

In the aforementioned embodiments, descriptions have been made on a case where the first process gas and the second process gas are alternately supplied. However, the present disclosure may be applied to a case where the first process gas and the second process gas are simultaneously supplied.

In the aforementioned embodiments, descriptions have been made on an example where the HCDS gas is used as a precursor gas. However, the present disclosure is not limited to this example. For example, as the precursor gas, in addition to the HCDS gas, it may be possible to use an inorganic halosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, i.e., silicon tetrachloride ($SiCl_4$, abbreviation: STC) gas, an octachlorotrisilane ($Si_3Cl_8$, abbreviation: OCTS) gas or the like, or a halogen-group-free amino-based (amine-based) silane precursor gas such as a trisdimethylaminosilane ($Si[N(CH_3)_2]_3H$, abbreviation: 3DMAS) gas, a tetrakisdimethylaminosilane ($Si[N(CH_3)_2]_4$, abbreviation: 4DMAS) gas, a bisdiethylaminosilane ($Si[N(C_2H_5)_2]_2H_2$, abbreviation: BDEAS) gas, a bis-tert-butylaminosilane ($SiH_2[NH(C_4H_9)]_2$, abbreviation: BTBAS) gas or the like. Furthermore, as the precursor gas, it may be possible to use a halogen-group-free inorganic silane precursor gas such as a monosilane ($SiH_4$, abbreviation: MS) gas, a disilane ($Si_2H_6$, abbreviation: DS) gas, a trisilane ($Si_3H_8$, abbreviation: TS) gas or the like.

In the aforementioned embodiments, descriptions have been made on an example where the $NH_3$ gas is used as a reaction gas. However, the present disclosure is not limited to this example. For example, as the reaction gas, in addition to the $NH_3$ gas, it may be possible to use a hydrogen nitride-based gas such as a diazene ($N_2H_2$) gas, a hydrazine ($N_2H_4$) gas, an $N_3H_8$ gas or the like, or a gas containing these compounds. Furthermore, as the reaction gas, it may be possible to use an ethylamine-based gas such as a triethylamine (($C_2H_5)_3N$, abbreviation: TEA) gas, a diethylamine (($C_2H_5)_2NH$, abbreviation: DEA) gas, a monoethylamine ($C_2H_5NH_2$, abbreviation: MEA) gas or the like, or a methylamine-based gas such as a trimethylamine (($CH_3)_3N$, abbreviation: TMA) gas, a dimethylamine (($CH_3)_2NH$, abbreviation: DMA) gas, a monomethylamine ($CH_3NH_2$, abbreviation: MMA) gas or the like. Moreover, as the reaction gas, it may be possible to use an organic hydrazine-based gas such as a trimethylhydrazine (($CH_3)_2N_2CH_3)H$, abbreviation: TMH) gas or the like.

In the aforementioned embodiments, descriptions have been made on an example where the SiN film is formed using the HCDS gas as the precursor gas and using the nitrogen (N)-containing gas (nitriding gas) such as the $NH_3$ gas or the like as the reaction gas. However, the present disclosure is not limited to this example. Alternatively or additionally, it may be possible to form an SiO film, an SiON film, an SiOCN film, an SiOC film, an SiCN film, an SiBN film, an SiBCN film or the like using an oxygen (O)-containing gas (oxidizing gas) such as an oxygen ($O_2$) gas or the like, a carbon (C)-containing gas such as a propylene ($C_3H_6$) gas or the like, or a boron (B)-containing gas such as a boron trichloride ($BCl_3$) gas or the like. The order of supplying the respective gases may be appropriately changed. Even in the case of forming these films, it may be possible to perform film formation under the same processing conditions as those of the aforementioned embodiments. Effects similar to those of the aforementioned embodiments are achieved.

In the aforementioned embodiments, descriptions have been made on an example where the silicon-based insulation film such as the SiN film or the like is formed. However, the present disclosure is not limited to this example. For example, the present disclosure may be suitably applied to a case where a film containing a metal element such as titanium (Ti), zirconium (Zr), hafnium (Hf), tantalum (Ta), niobium (Nb), aluminum (Al), molybdenum (Mo), tungsten (W) or the like, namely a metal-based film, is formed on a substrate.

The order of supplying the respective gases may be appropriately changed. Even in the case of performing this film formation, it may be possible to perform film formation under the same processing conditions as those of the aforementioned embodiments. Effects similar to those of the aforementioned embodiments are achieved.

That is to say, the present disclosure may be suitably applied to a case where a film containing a predetermined element such as a semiconductor element, a metal element or the like is formed.

In the aforementioned embodiments, descriptions have been made on an example where a film is deposited on a substrate. However, the present disclosure is not limited to this example. For example, the present disclosure may be suitably applied to a case where a substrate or a film formed on the substrate is subjected to an oxidizing process, a diffusing process, an annealing process, an etching process or the like. Furthermore, the embodiments and modifications described above may be appropriately combined. The processing conditions used at this time may be similar to, for example, the processing conditions of the embodiments and modifications described above.

While the embodiments of the present disclosure have been specifically described above, the present disclosure is not limited to the aforementioned embodiments but may be differently modified without departing from the spirit of the present disclosure.

Aspects of Present Disclosure

Hereinafter, some aspects of the present disclosure will be additionally described as supplementary notes.

(Supplementary Note 1)

According to one aspect of the present disclosure, there is provided a thermocouple, including:
 a temperature measuring portion configured to measure an internal temperature of a reaction tube;
 a main body portion provided therein with a wire which constitutes the temperature measuring portion; and
 a cushioning portion attached to the main body portion at least in the vicinity of the temperature measuring portion,
 wherein the thermocouple is fixed to an outer surface of the reaction tube in a state in which the thermocouple makes contact with the reaction tube through the cushioning portion.

(Supplementary Note 2)

The thermocouple of Supplementary Note 1 may further include:
 a protective tube attached to the main body portion below a position facing a substrate processing region configured to protect the wire,
 wherein the protective tube may be configured such that an outer diameter of one end portion of the protective tube bonded to the main body portion is smaller than an outer diameter of the other end portion of the protective tube.

(Supplementary Note 3)

In the thermocouple of Supplementary Note 2, the cushioning portion may be installed in a boundary between the main body portion and the protective tube, and an outer diameter of the cushioning portion may be larger than diameters of the main body portion and the protective tube adjoining the cushioning portion.

(Supplementary Note 4)

According to another aspect of the present disclosure, there is provided a plate-shaped insulation member which is a cushioning member installed in the thermocouple of any one of Supplementary Notes 1 to 3 and which is fixed to the main body portion provided therein with the temperature measuring portion.

(Supplementary Note 5)

According to another aspect of the present disclosure, there is provided a substrate processing apparatus for accommodating a plurality of substrates within a reaction tube and processing the substrates, including:
 a heating part configured to heat an interior of the reaction tube; and
 a thermocouple (temperature detection part) including a temperature measuring portion configured to measure an internal temperature of the reaction tube, a main body portion provided therein with a wire which constitutes the temperature measuring portion, a cushioning portion installed in the main body portion at least in the vicinity of the temperature measuring portion, and a protective member fixed at least between the heating part and the temperature measuring portion which faces the heating part,
 wherein the thermocouple is fixed to an outer surface of the reaction tube in a state in which the thermocouple makes contact with the reaction tube through the cushioning portion interposed between the reaction tube and the protective member when the protective member is fixed to the reaction tube.

(Supplementary Note 6)

In the apparatus of Supplementary Note 5, the temperature detection part may be configured to include a protection tube connected to the main body portion under the temperature detection part and configured to protect the wire, and an acquisition portion connected to the wire and configured to acquire the temperature measured by the temperature measuring portion.

(Supplementary Note 7)

The apparatus of Supplementary Note 5 may further include:
 a substrate holding member configured to horizontally hold the substrates in multiple stages,
 wherein the protective member may be configured to cover at least a substrate processing region where the substrates are held by the substrate holding member,
 the heating part may include a plurality of independent heating zones (a U zone, a CU zone, a CL zone and an L zone), and
 the protective member (cover) may be installed along the reaction tube so as to cover at least one of the heating zones (the CU zone or the CL zone).

(Supplementary Note 8)

In the apparatus of Supplementary Note 5, a quartz-made fixing member may be installed in a furnace opening portion formed in a lower portion of the reaction tube, and the thermocouple may be configured such that the protective member is fixed to the furnace opening portion through the fixing member.

(Supplementary Note 9)

In the apparatus of Supplementary Note 5 or 7, the heating part may include a plurality of independent heating zones (a U zone, a CU zone, a CL zone and an L zone),
- the temperature measuring portion may be installed in a number equal to or larger than the number of the heating zones, and
- the apparatus may further include a control part configured to, based on the temperature detected by the thermocouple, control at least the heating part so as to maintain the internal temperature of the reaction tube at a predetermined temperature.

(Supplementary Note 10)

The apparatus of Supplementary Note 5 may further include:
- a process gas supply system configured to supply a process gas into the reaction tube; and
- an exhaust system configured to exhaust an internal atmosphere of the reaction tube,
- wherein the reaction tube may include: a cylinder portion having a closed portion at an upper end thereof and an opening portion at a lower end thereof; a gas supply area formed outside one sidewall of the cylinder portion and connected to the process gas supply system; and a gas exhaust area formed outside the other sidewall of the cylinder portion, which is opposed to the gas supply area, and connected to the exhaust system.

(Supplementary Note 11)

According to another aspect of the present disclosure, there is provided a thermocouple, including:
- a first main body portion installed on a ceiling of a reaction tube;
- a second main body portion installed on a side surface of the reaction tube; and
- a connection portion configured to interconnect the first main body portion and the second main body portion,
- wherein the first main body portion includes a first temperature measuring portion which measures a temperature of the ceiling of the reaction tube, and the first temperature measuring portion is fixed to a central position of the reaction tube.

(Supplementary Note 12)

In the thermocouple of Supplementary Note 11, the second main body portion and the connection portion may be configured to accommodate at least a wire which constitutes the first temperature measuring portion.

(Supplementary Note 13)

In the thermocouple of Supplementary Note 11, the second main body portion may include at least a second temperature measuring portion configured to detect a temperature of a side surface of the reaction tube and a cushioning portion installed in the vicinity of the second temperature measuring portion, and
- the second temperature measuring portion may be fixed in a position close to an outer surface of the reaction tube, in a state in which the reaction tube and the second main body portion make contact with each other through the cushioning portion.

(Supplementary Note 14)

According to another aspect of the present disclosure, there is provided a substrate processing apparatus for accommodating a substrate holding member, which holds a plurality of substrates, within a reaction tube and processing the substrates, including:
- a thermocouple including a first main body portion provided with a first temperature measuring portion, which measures an internal temperature of the reaction tube, and installed on a ceiling of the reaction tube, a second main body portion installed on a side surface of the reaction tube, and a connection portion configured to interconnect the first main body portion and the second main body portion;
- a heating part configured to heat an interior of the reaction tube; and
- a ceiling cover installed between the heating part and the first main body portion facing the heating part, the ceiling cover having a space portion through which the first main body portion extends, the ceiling cover fixed to the ceiling of the reaction tube,
- wherein the first temperature measuring portion is fixed in a central position of the ceiling cover by fitting a projection portion formed in the first main body portion into an opening portion formed in the ceiling cover.

(Supplementary Note 15)

In the apparatus of Supplementary Note 14, the heating part may include a plurality of independent heating zones (a U zone, a CU zone, a CL zone and an L zone), and
- the first temperature measuring portion may be configured to detect a temperature of the substrates disposed in a position facing the U zone.

(Supplementary Note 16)

The apparatus of Supplementary Note 15 may further include:
- a full cover installed between the heating part and the reaction tube facing the heating part, the full cover having a space portion through which the second main body portion extends,
- wherein the second main body portion may be fixed to an outer surface of the reaction tube when the full cover is fixed to the reaction tube.

(Supplementary Note 17)

In the apparatus of Supplementary Note 16, the second main body portion may be configured such that when the second main body portion is fixed between the reaction tube and the full cover, the full cover is fitted to a fixing member installed on the reaction tube.

(Supplementary Note 18)

The apparatus of Supplementary Note 15 may further include:
- a full cover installed between the heating part and the reaction tube facing the heating part, the full cover having a space portion through which the second main body portion extends,
- wherein the second main body portion may include a second temperature measuring portion protected by the full cover and a cushioning portion attached to the vicinity of the second temperature measuring portion, and
- the second temperature measuring portion may be fixed in a position close to an outer surface of the reaction tube in a state in which the second temperature measuring portion makes contact with the reaction tube through the cushioning portion interposed between the reaction tube and the full cover when the full cover is fixed to the reaction tube.

(Supplementary Note 19)

According to another aspect of the present disclosure, there is provided a substrate processing apparatus for accommodating a substrate holding member, which holds a plurality of substrates, within a reaction tube and processing the substrates, including:

a first heating part configured to heat the substrates disposed in positions facing a plurality of independent heating zones (a U zone, a CU zone, a CL zone and an L zone);

a second heating part installed on a ceiling of the reaction tube and configured to heat the substrates disposed at a position facing the U zone;

a first thermocouple installed on a sidewall of the reaction tube and configured to detect a temperature of a position facing the first heating part;

a second thermocouple including a first main body portion installed on the ceiling of the reaction tube, a second main body portion installed on a side surface of the reaction tube, and a connection portion configured to interconnect the first main body portion and the second main body portion;

a full cover configured to fix the first thermocouple and the second main body portion to the sidewall of the reaction tube;

a ceiling cover configured to fix the first main body portion to the ceiling of the reaction tube; and a control part configured to, based on the temperatures detected by the first thermocouple and the second thermocouple, control at least the first heating part and the second heating part so as to maintain an internal temperature of the reaction tube at a predetermined temperature.

(Supplementary Note 20)

In the apparatus of Supplementary Note 19, the first main body portion may include a first temperature measuring portion configured to measure the internal temperature of the reaction tube, and the first temperature measuring portion may be fixed in a central position of the ceiling of the reaction tube by fitting a projection portion attached to the first main body portion into an opening portion formed in the full cover, the first temperature measuring portion configured to measure a temperature of a center of the substrate heated by the second heating part.

(Supplementary Note 21)

In the apparatus of Supplementary Note 19, the first main body portion may include a first temperature measuring portion disposed at the ceiling of the reaction tube and configured to measure the internal temperature of the reaction tube, the first thermocouple may include a second temperature measuring portion disposed at a position facing the heating zones (the U zone, the CU zone, the CL zone and the L zone) and configured to measure the internal temperature of the reaction tube, and the apparatus may be configured to, based on the temperatures detected by the first temperature measuring portion and the second temperature measuring portion, control at least the first heating part and the second heating part so as to maintain the internal temperature of the reaction tube at a predetermined temperature.

(Supplementary Note 22)

In the apparatus of Supplementary Note 19, the first main body portion may include a first temperature measuring portion disposed at the ceiling of the reaction tube and configured to measure the internal temperature of the reaction tube, the first thermocouple may include a second temperature measuring portion disposed in a position facing the U zone and configured to measure the internal temperature of the reaction tube, and the apparatus may be configured to, based on the temperatures detected by the first temperature measuring portion and the second temperature measuring portion, control at least the first heating part and the second heating part so as to maintain the temperature of the substrates disposed in the U zone at a predetermined temperature.

(Supplementary Note 23)

In the apparatus of Supplementary Note 22, the first temperature measuring portion may be configured to detect a temperature of centers of the substrates disposed in the U zone, the second temperature measuring portion may be configured to detect a temperature from edge portions of the substrates disposed in the U zone, and the apparatus may be configured to maintain the temperature of the substrates disposed in the U zone at a predetermined temperature by controlling the first heating part and the second heating part so that at least a difference between the temperatures detected by the first temperature measuring portion and the second temperature measuring portion falls within a predetermined range.

(Supplementary Note 24)

In the apparatus of Supplementary Note 23, the temperature of the substrate held at the uppermost side of the substrate holding member among the substrates disposed in the U zone may be maintained at the predetermined temperature.

(Supplementary Note 25)

In the apparatus of Supplementary Note 22, the first temperature measuring portion may be configured to detect a temperature of centers of the substrates disposed in the U zone, the second temperature measuring portion may be configured to detect a temperature from edge portions of the substrates disposed in the heating zones, and the apparatus may be configured to maintain the temperature of the substrates disposed in the heating zones at a predetermined temperature by controlling the first heating part and the second heating part so that at least a difference between the temperatures detected by the first temperature measuring portion and the second temperature measuring portion installed in the U zone falls within a predetermined range.

(Supplementary Note 26)

In the apparatus of Supplementary Note 19, the full cover may be fitted to a fixing member installed on the reaction tube when first thermocouple and the second main body portion are fixed to the reaction tube.

(Supplementary Note 27)

According to another aspect of the present disclosure, there is provided a substrate processing apparatus for accommodating a substrate holding member, which holds a plurality of substrates, within a reaction tube and processing the substrates, including:

a heating part configured to heat an interior of the reaction tube;

a temperature detection part (thermocouple) configured to detect an internal temperature of the reaction tube; and a cover installed between the heating part and a temperature measuring portion facing the heating part wherein the cover is fixed to the reaction tube in a state in which the thermocouple is installed, so that the thermocouple is fixed in a close proximity to the reaction tube.

(Supplementary Note 28)

In the apparatus of Supplementary Note 27, the temperature measuring portion may be covered with a center of the cover when the thermocouple is fixed between the reaction tube and the cover.

(Supplementary Note 29)

In the apparatus of Supplementary Note 28, at least a lower portion of the cover may be configured such that a thermal insulator is installed between the lower portion of the cover and the thermocouple.

(Supplementary Note 30)

According to another aspect of the present disclosure, there is provided a method of manufacturing a semiconductor device, including:

causing a substrate holding member to hold a plurality of substrates;

loading the substrate holding member into a reaction tube; and processing the substrates, while controlling a heating part so as to maintain an internal temperature of the reaction tube at a predetermined temperature, based on a temperature detected by a thermocouple, wherein the thermocouple includes a temperature measuring portion configured to measure the internal temperature of the reaction tube, a main body portion provided therein with a wire which constitutes the temperature measuring portion, and a cushioning portion attached to the main body portion at least in the vicinity of the temperature measuring portion, and wherein the thermocouple is fixed to an outer surface of the reaction tube in a state in which the thermocouple makes contact with the reaction tube through the cushioning portion.

(Supplementary Note 31)

According to another aspect of the present disclosure, there is provided a program or a non-transitory computer-readable recording medium storing the program, wherein the program is configured to cause a computer to perform:

causing a substrate holding member to hold a plurality of substrates;

loading the substrate holding member into a reaction tube; and processing the substrates, while controlling a heating part so as to maintain an internal temperature of the reaction tube at a predetermined temperature, based on a temperature detected by a thermocouple, wherein the thermocouple includes a temperature measuring portion configured to measure the internal temperature of the reaction tube, a main body portion provided therein with a wire which constitutes the temperature measuring portion, and a cushioning portion attached to the main body portion at least in the vicinity of the temperature measuring portion, and wherein the thermocouple is fixed to an outer surface of the reaction tube in a state in which the thermocouple makes contact with the reaction tube through the cushioning portion.

According to the present disclosure in some embodiments, it is possible to provide a configuration in which a thermocouple is disposed outside a reaction tube.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature sensor, comprising:
a first main body portion, which is installed between a reaction tube and a first protective member including an opening portion, including:
a first temperature measuring portion disposed on a first side of the first main body portion in a longitudinal direction and configured to measure a temperature in the reaction tube; and
a positioning portion installed on a second side of the first main body portion in the longitudinal direction to be spaced apart from the first temperature measuring portion;
wherein the first temperature measuring portion is disposed between the first protective member and a ceiling portion of the reaction tube, at an outer surface of the reaction tube, as the positioning portion is inserted into the opening portion.

2. The temperature sensor of claim 1, wherein the first temperature measuring portion is disposed at a specific position with respect to the reaction tube by the positioning portion, as the first protective portion is disposed at the reaction tube.

3. The temperature sensor of claim 1, wherein the first temperature measuring portion is configured to be disposed at a central portion of the ceiling portion of the reaction tube by the positioning portion.

4. The temperature sensor of claim 1, wherein the first protective member further includes at least a first space portion through which the first main body portion is passed.

5. The temperature sensor of claim 1, further comprising a second main body portion which is installed on a side surface of the reaction tube and in which a wire constituting the first temperature measuring portion is provided,
wherein the second main body portion is configured not to include a temperature measuring portion that detects a temperature of a substrate.

6. The temperature sensor of claim 5, further comprising a connection portion configured to interconnect the first main body portion and the second main body portion,
wherein the connection portion is configured to cover the wire with a member different from the first main body portion and the second main body portion.

7. The temperature sensor of claim 6, wherein the connection portion is configured to cover the wire with an insulation member.

8. The temperature sensor of claim 1, wherein the positioning portion is installed to be spaced apart from the reaction tube farther than the first temperature measuring portion.

9. The temperature sensor of claim 1, wherein the first protective member is configured to cover the first main body portion entirely.

10. A substrate processing apparatus comprising a temperature sensor that includes:

a first main body portion, which is installed between a reaction tube and a first protective member including an opening portion, including:
- a first temperature measuring portion disposed on a first side of the first main body portion in a longitudinal direction and configured to measure a temperature in the reaction tube; and
- a positioning portion installed on a second side of the first main body portion in the longitudinal direction to be spaced apart from the first temperature measuring portion;

wherein the first temperature measuring portion is disposed between the first protective member and a ceiling portion of the reaction tube, at an outer surface of the reaction tube, as the positioning portion is inserted into the opening portion.

11. The apparatus of claim 10, further comprising a first heater configured to heat, from a top of the reaction tube, a substrate which is disposed at a position facing a heating zone, which is positioned uppermost among a plurality of heating zones,
   wherein the first temperature measuring portion is configured to detect a temperature of the substrate heated by the first heater.

12. The apparatus of claim 10, wherein the first protective member is provided with a first fixing portion that fixes the first temperature measuring portion, and
   wherein the first fixing portion is configured to fix the first main body portion at a position disposed by the positioning portion.

13. The apparatus of claim 10, wherein a thickness of the ceiling portion of the reaction tube is configured to be larger than a thickness of a sidewall of the reaction tube.

14. The apparatus of claim 10, further comprising a second heater configured to heat substrates disposed at a position facing a plurality of heating zones,
   wherein the temperature sensor is configured to provide a second main body portion which is installed at a position facing the second heater.

15. The apparatus of claim 14, wherein the second main body portion is configured not to include a temperature measuring portion that detects a temperature of the substrates.

16. The apparatus of claim 10, wherein the positioning portion is installed to be spaced apart from the reaction tube farther than the first temperature measuring portion.

17. The apparatus of claim 10, wherein the first temperature measuring portion is disposed at a central portion of the ceiling portion of the reaction tube by the positioning portion, and the first main body portion is configured to make contact with a surface of the reaction tube.

18. The apparatus of claim 10, wherein the first protective member is configured to cover the first main body portion entirely.

19. The apparatus of claim 10, wherein the first protective member further includes a first space portion through which the first main body portion is passed.

20. A method of manufacturing a semiconductor device comprising:
   processing a substrate while maintaining a temperature in a reaction tube at a predetermined temperature based on a temperature detected by a temperature sensor that includes:
   a first main body portion, which is installed between the reaction tube and a first protective member including an opening portion, including:
   - a first temperature measuring portion disposed on a first side of the first main body portion in a longitudinal direction and configured to measure a temperature in the reaction tube; and
   - a positioning portion installed on a second side of the first main body portion in the longitudinal direction to be spaced apart from the first temperature measuring portion;

wherein the first temperature measuring portion is disposed between the first protective member and a ceiling portion of the reaction tube, at an outer surface of the reaction tube, as the positioning portion is inserted into the opening portion.

* * * * *